United States Patent
Masoleh et al.

(10) Patent No.: US 10,332,683 B2
(45) Date of Patent: Jun. 25, 2019

(54) PSEUDO-SHIELDED CAPACITOR STRUCTURES

(71) Applicant: Apple Inc., Cupertino, CA (US)

(72) Inventors: Behzad Reyhani Masoleh, San Francisco, CA (US); Ming Y. Tsai, San Jose, CA (US); Paul A. Martinez, Morgan Hill, CA (US); Scott D. Morrison, Watertown, MA (US); Tracey L. Chavers, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/717,431

(22) Filed: Sep. 27, 2017

(65) Prior Publication Data

US 2019/0096581 A1    Mar. 28, 2019

(51) Int. Cl.
| | |
|---|---|
| *H01G 4/248* | (2006.01) |
| *H01G 4/30* | (2006.01) |
| *H01G 4/002* | (2006.01) |
| *H01G 4/224* | (2006.01) |
| *H05K 1/02* | (2006.01) |
| *H05K 1/18* | (2006.01) |
| *H05K 1/11* | (2006.01) |
| *H01G 4/232* | (2006.01) |
| *H05K 3/34* | (2006.01) |

(52) U.S. Cl.
CPC .............. *H01G 4/248* (2013.01); *H01G 4/002* (2013.01); *H01G 4/224* (2013.01); *H01G 4/30* (2013.01); *H05K 1/0216* (2013.01); *H05K 1/181* (2013.01); *H01G 4/232* (2013.01); *H05K 1/111* (2013.01); *H05K 3/34* (2013.01); *H05K 2201/10015* (2013.01); *H05K 2201/10371* (2013.01)

(58) Field of Classification Search
CPC ........ H01G 4/248; H01G 4/002; H01G 4/224; H01G 4/30; H05K 1/0216; H05K 1/181
USPC ........................................................ 174/260
See application file for complete search history.

(56) References Cited

U.S. PATENT DOCUMENTS

| | | | |
|---|---|---|---|
| 9,390,862 B2 * | 7/2016 | Moon ....................... | H01G 4/40 |
| 2008/0218937 A1 * | 9/2008 | Kehoe .................... | H01G 2/065 |
| | | | 361/328 |

FOREIGN PATENT DOCUMENTS

| | | | |
|---|---|---|---|
| EP | 345166 | * | 12/1989 |
| JP | 06176959 | * | 6/1994 |

* cited by examiner

*Primary Examiner* — Timothy J Thompson
*Assistant Examiner* — Charles Pizzuto
(74) *Attorney, Agent, or Firm* — Fletcher Yoder PC

(57) ABSTRACT

Capacitor devices with electrodes that are geometrically arranged to reduce parasitic capacitances are described. The capacitors may be multilayer ceramic capacitor (MLCC) structures in which certain electrodes may have a clearance from a capacitor structure wall, such as top wall. In circuits and devices where that particular capacitor wall may be placed near a shielding structure, the clearance may reduce unintended parasitic capacitances between the shield structure and the electrodes. As a result, the shield structures may be placed closer to the electronic components, which may allow circuit boards and electronic devices with a lower profile.

23 Claims, 22 Drawing Sheets

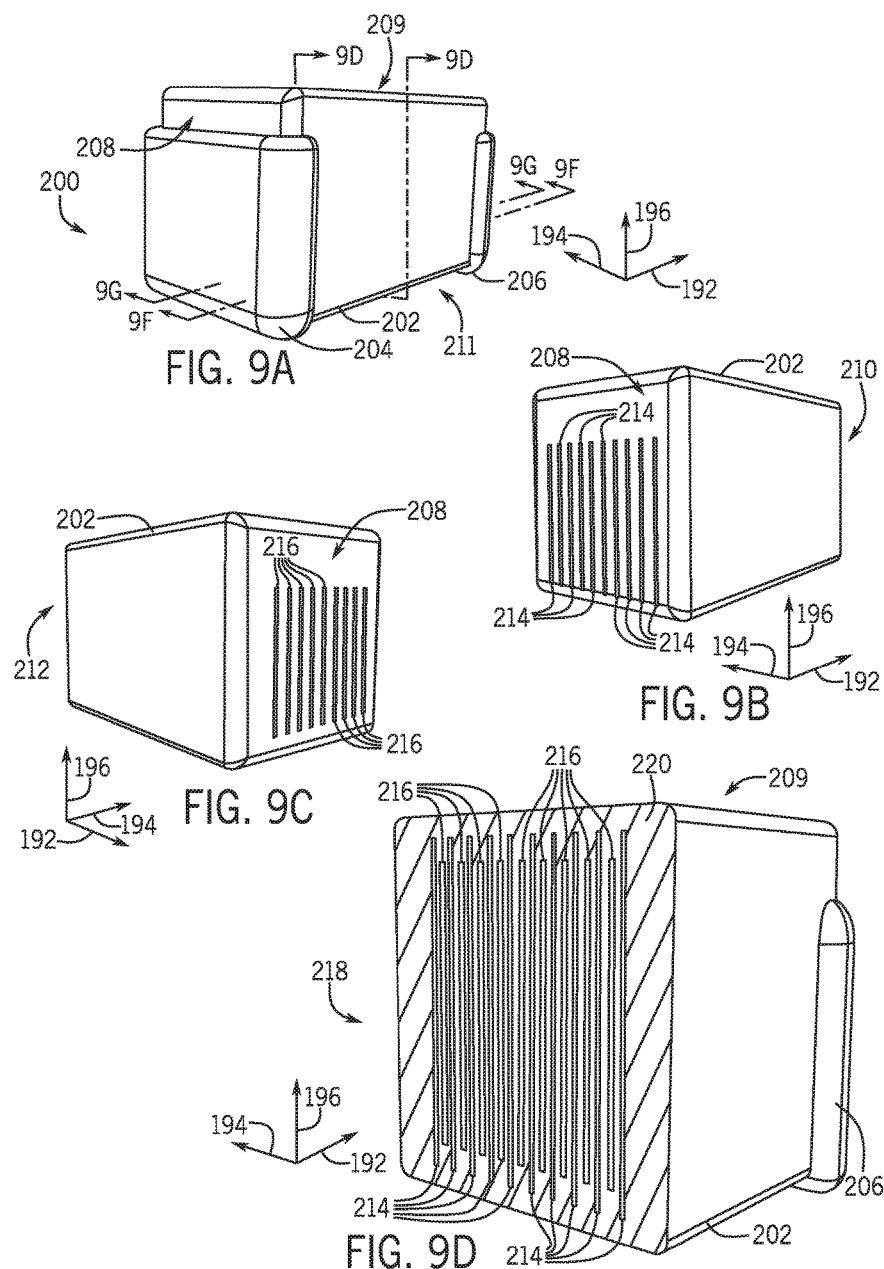

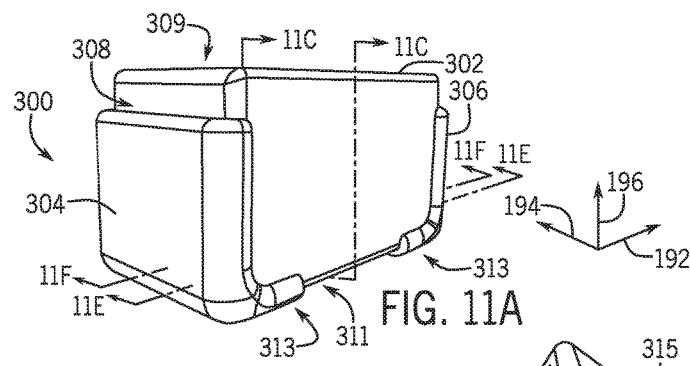
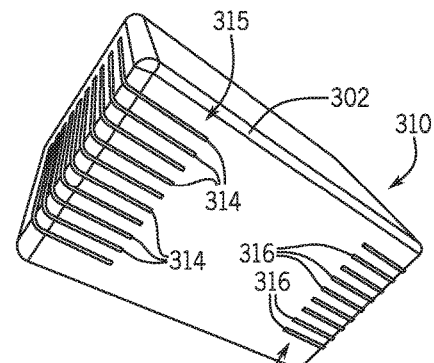
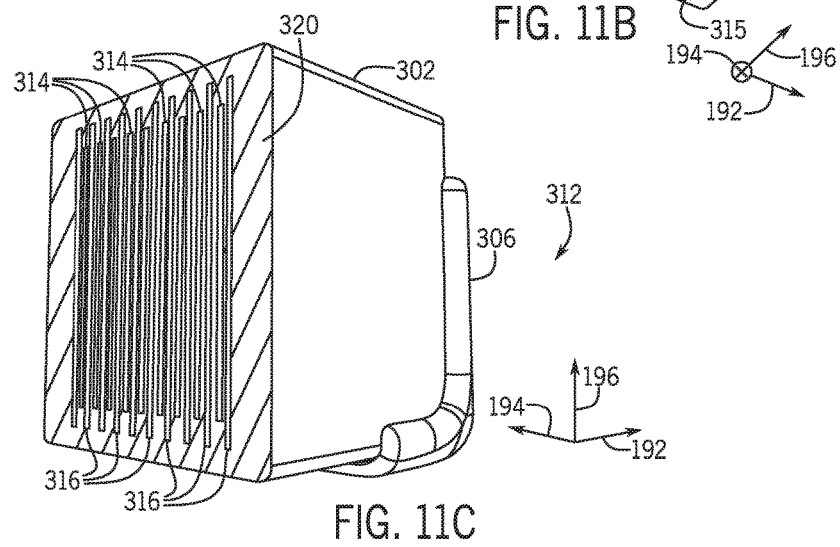

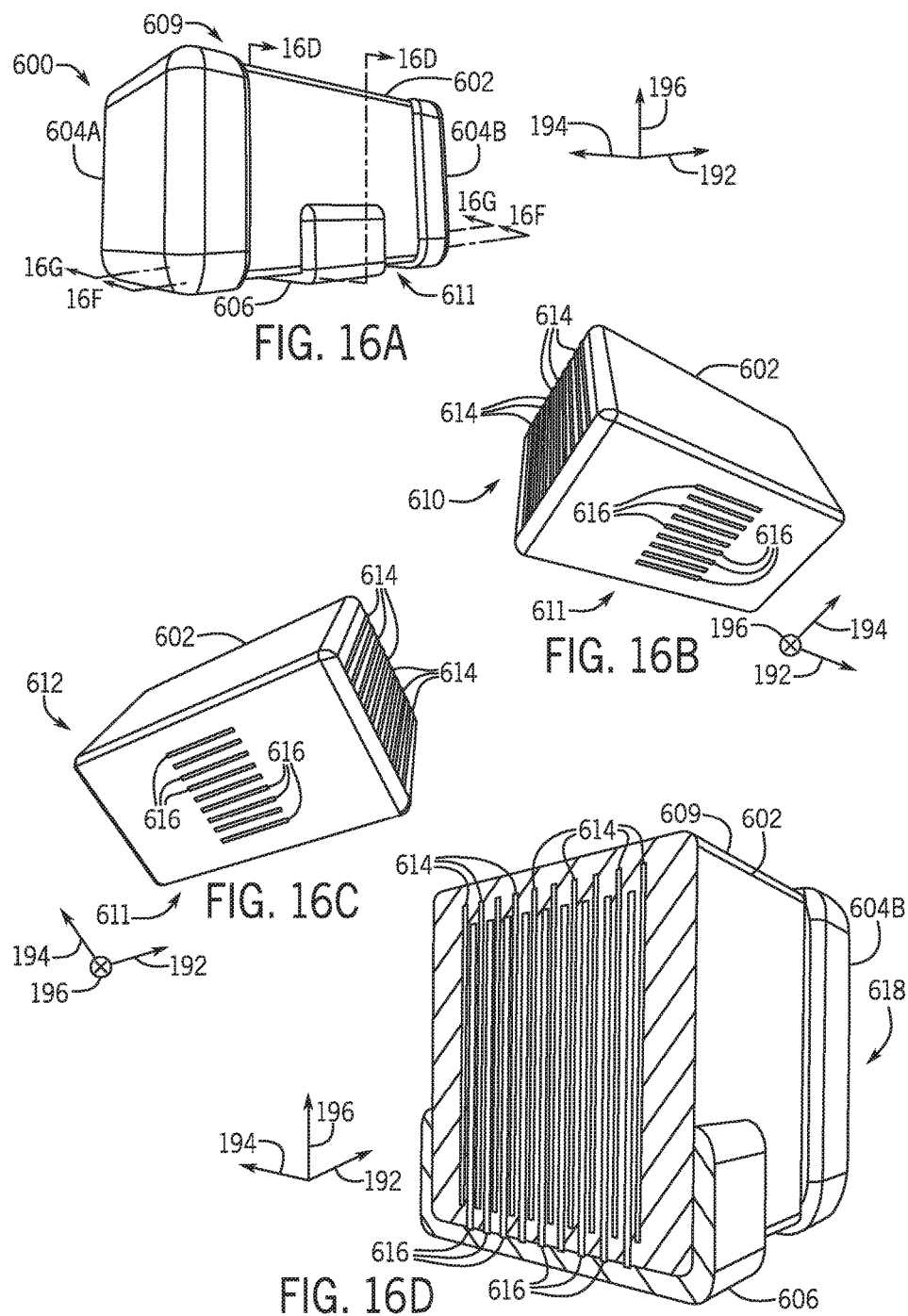

PSEUDO-SHIELDED CAPACITOR STRUCTURES

BACKGROUND

The present disclosure relates generally to capacitor structures, and more particularly, to capacitor structures with geometric arrangement that may reduce parasitic effects.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices include electronic circuits that employ capacitors in its circuit boards (e.g., printed circuit board) to perform functions such as energy storage, filtering, tuning, impedance matching, filtering, and other purposes. These electronic devices may also have shielding structures, such as a shield ground plane, a grounding layer, a shield lid, a ground rail, or a sputter, which may be used to prevent or mitigate interference from the environment to components of the circuit device. As the dimension of consumer products reduce, the spacing between the components attached to the circuit board may decrease. For example, reduction in the dimensions may bring the shielding structures closer to the capacitors. The presence of the grounding structures in proximity with the capacitors may lead to parasitic interferences that were not considered during the design of the circuit board, and may lead to loss of performance of malfunction of the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments described herein are related to capacitor devices that may include asymmetrically arranged electrodes and/or terminations that mitigate parasitic interferences from grounded shielding structures. The capacitors may be designed to have a ground terminal that may be coupled to a ground connection and a signal terminal that may be coupled to a signal source. The capacitors may be designed such that the signal terminal and/or the electrodes directly coupled to the signal terminal may be separated from shielding structures near the capacitor. In some embodiments, the electrodes coupled to the signal terminal may have a clearance from a wall of the capacitor that may prevent parasitic capacitances. In some embodiments, the signal terminals may be constructed away from the grounding structures. Electrode arrangements for the capacitors may be produced by using multilayer ceramic capacitor (MLCC) methods and and techniques disclosed herein. Terminations for the capacitors may be produced using the capacitor forming techniques discussed. The use of the capacitor structures may allow reduction of the dimensions of the electronic devices by allowing reduction of the spacing between capacitors and shielding structures.

BRIEF DESCRIPTION OF THE DRAWINGS

Various aspects of this disclosure may be better understood upon reading the following detailed description and upon reference to the drawings in which:

FIG. 9A is a perspective view of an embodiment of a capacitor with asymmetric electrodes, and may present reduced parasitic capacitance;

FIG. 9B is a perspective view of the capacitor of FIG. 9A illustrating electrode terminations, in accordance with an embodiment;

FIG. 9C is another perspective view of the capacitor of FIG. 9A illustrating signal electrode terminations, in accordance with an embodiment;

FIG. 9D is a cross-section perspective view of the capacitor of FIG. 9A, in accordance with an embodiment;

FIG. 11A is a perspective view of an embodiment of a capacitor with asymmetric electrodes and with side and bottom terminations;

FIG. 11B is a bottom perspective view the capacitor of FIG. 12A illustrating electrode terminations, in accordance with an embodiment;

FIG. 11C is a cross-section perspective view of the capacitor of FIG. 12A, in accordance with an embodiment;

FIG. 16A is a perspective view of an embodiment of a capacitor with asymmetric electrodes and asymmetric terminals;

FIG. 16B is a bottom perspective view of the capacitor of FIG. 16A illustrating electrode terminations, in accordance with an embodiment;

FIG. 16C is another bottom perspective view of the capacitor of FIG. 16A illustrating electrode terminations, in accordance with an embodiment;

FIG. 16D is a cross-section perspective view of the capacitor of FIG. 16A, in accordance with an embodiment;

DETAILED DESCRIPTION OF SPECIFIC EMBODIMENTS

Figure 1:
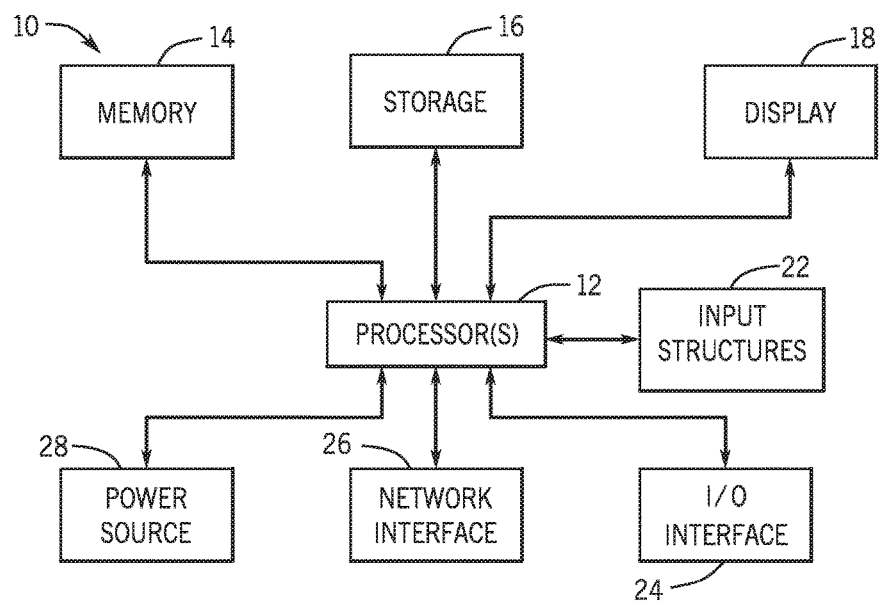
FIG. 1 is a schematic block diagram of an electronic device that may benefit from the inclusion of one or more pseudo-shielded capacitor devices, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electronic devices may employ capacitors for energy storage, tuning, impedance matching, noise filtering, and other such functions. To that end, capacitors may have its terminals coupled to circuit boards. In many circuit designs, the capacitors may have one terminal coupled to a ground of the circuit board or device, and a second terminal coupled to a terminal that provides a signal. Electronic device may also haves shielding structures, such as shield lids, shield frames, or ground plates, covering components attached to the circuit board, and may be coupled to a ground connection. The shielding structures may reduce interference of external environment with the components or the circuitry in the electronic device. As an example, a shield frame may operate as a Faraday cage to prevent external electromagnetic radiation from damaging components or altering signals or voltages.

As the dimensions of the electrical components become smaller allowing more portable and/or more power efficient devices, structures within the electronic device may become closer to each other. For example, the grounded shielding structures may become closer to the components in the circuit board, such as capacitors. In some situations, the internal geometry of the electrodes in the capacitor and/or of the terminal may lead to of parasitic capacitances between the capacitor and grounded shielding structures. The presence of these parasitic capacitances may be particularly detrimental in situations such as filtering or impedance matching, in which small changes in the capacitance may drastically change the circuit behavior. Moreover, certain signal frequencies in the capacitor may generate electrical coupling between the capacitor and the shielding structures due to these parasitic capacitances. This parasitic coupling may cause the ground plane to carry the signal frequencies to other components close to the shielding structure, leading to undesired parasitic coupling between components across the circuit board.

As discussed above, the parasitic capacitances may occur when electrodes and/or terminals of the capacitor are close to the shielding structures. In the present application, pseudo-shielded capacitors and capacitor structures having geometries with a specified distance between electrodes and/or terminals and a top wall of the capacitor (e.g., a top side of the capacitor) are described. Embodiments described include asymmetric capacitors having a first terminal designed for coupling with a ground connection (e.g., a ground terminal), and the second terminal designed for receiving a signal (e.g., a signal terminal). In certain embodiments, the capacitors may be designed such that, when coupled to a circuit board, the ground terminal is closer to a shielding structure than the signal terminal.

In certain embodiments, the electrodes may be designed such that the ground electrodes (e.g., electrodes directly coupled to the ground terminal) are closer to a top wall of the capacitor than the signal electrodes (e.g., electrodes directly coupled to the signal terminal). Certain embodiments may include markings in external surfaces (e.g., external visual markings) of the capacitor to indicate the appropriate connection. Methods for assembling the capacitors as well as methods for coupling the capacitors in view of the markings are also described. The use of the pseudo-shielded capacitors described herein in shielded circuit boards in electrical devices may allow substantial reduction in the dimensions of the electronic device.

With the foregoing in mind, a general description of suitable electronic devices that may include shielded circuit boards having pseudo-shielded capacitors in its circuitry will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
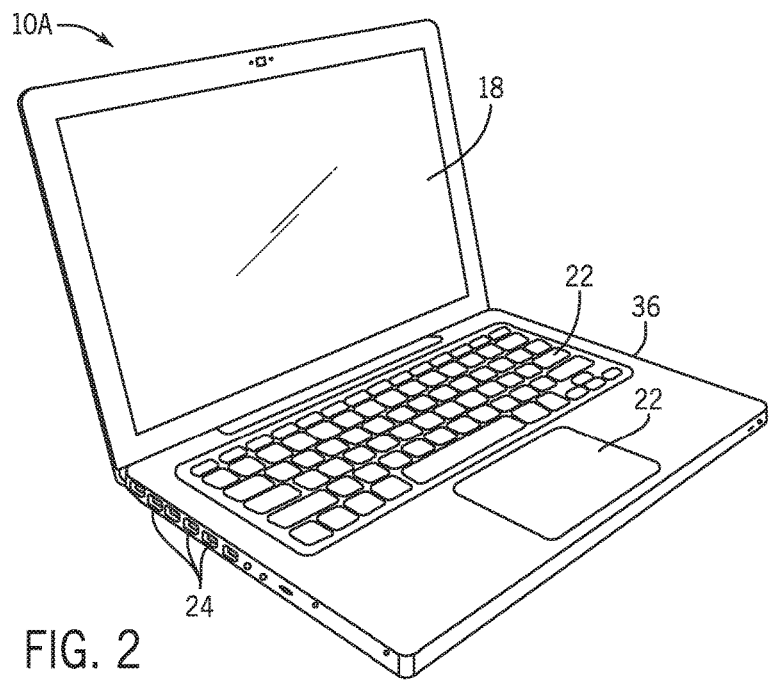
FIG. 2 is a perspective view of a notebook computer representing an embodiment of the electronic device of FIG. 1.
Figure 4:
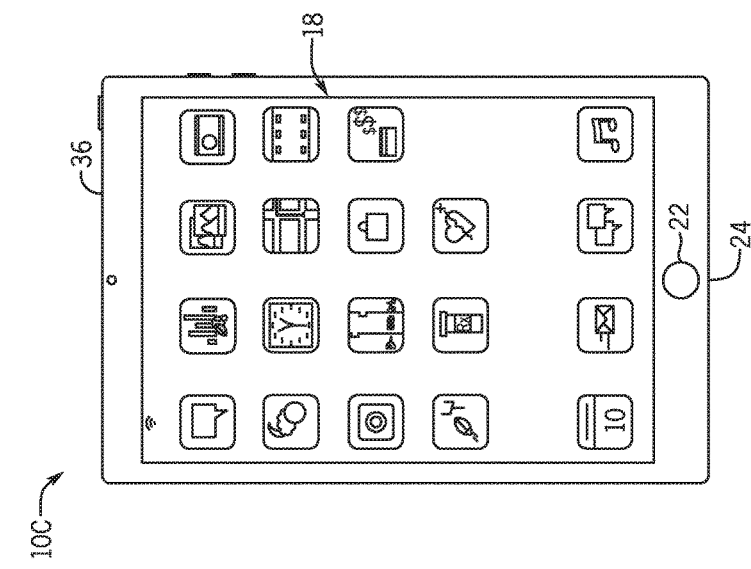
FIG. 4 is a front view of another hand-held device representing another embodiment of the electronic device of FIG. 1.
Figure 3:
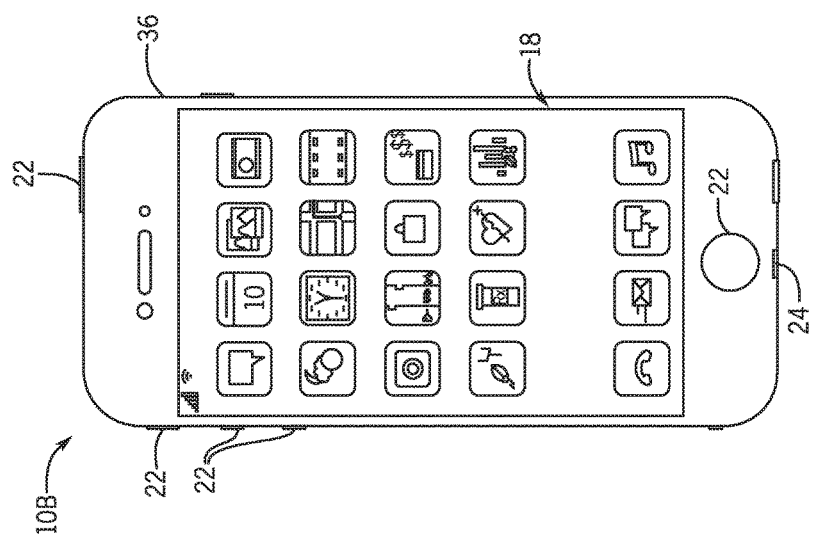
FIG. 3 is a front view of a hand-held device representing another embodiment of the electronic device of FIG. 1.
Figure 5:
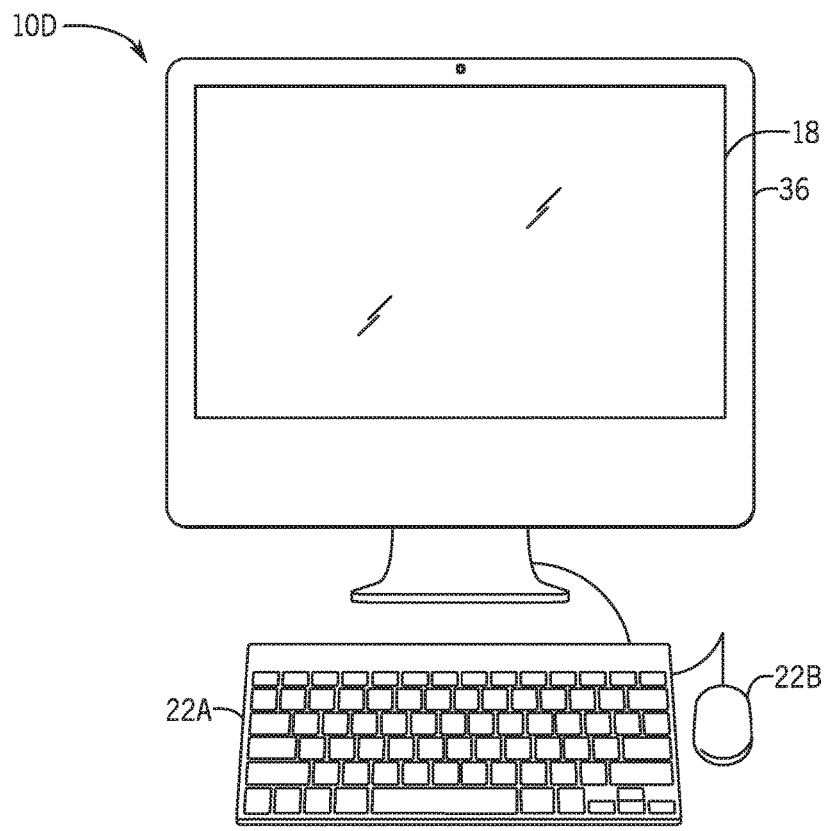
FIG. 5 is a front view of a desktop computer representing another embodiment of the electronic device of FIG. 1.
Figure 6:
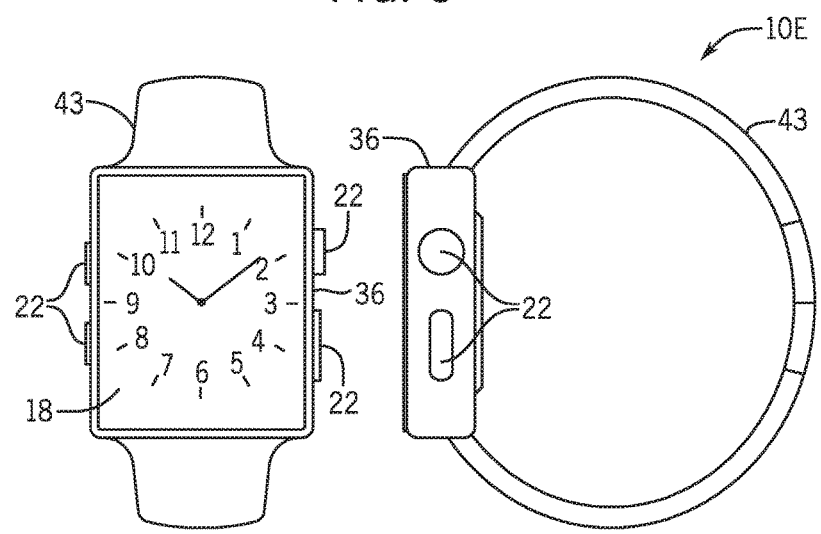
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. Network interfaces 26 such as the one described above may benefit from the use of tuning circuitry, impedance matching circuitry and/or noise filtering circuits that may include pseudo-shielded capacitor devices such as the ones described herein. As further illustrated, the electronic device 10 may include a power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage. The enclosure 36 may also perform the role of a shielding structure, as discussed herein. The enclosure 36 may surround the display 18. The I/O interfaces 24 may open through the enclosure 36 and may include, for example, an I/O port for a hard-wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. Certain regions of enclosure 36 may also provide electromagnetic shielding to components of the computer 10D, as discussed herein. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E. Due to its reduced dimensions, the enclosure 36 of the wearable electronic device 10E may be a shielding structure for its internal circuit boards.

Figure 7A:
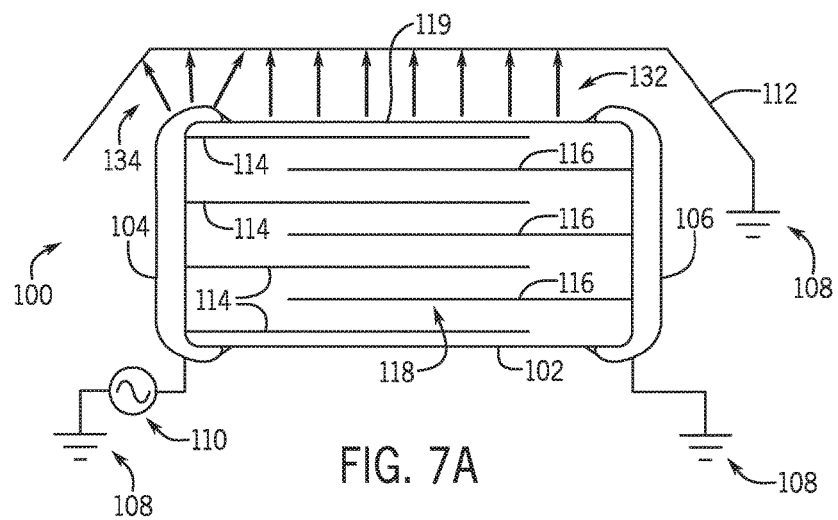
FIG. 7A is a schematic diagram of an electronic device, such as the device of FIG. 1, and may include an attached capacitor with horizontal electrodes in proximity to an attached shielding structure, in accordance with an embodiment.
Figure 7B:
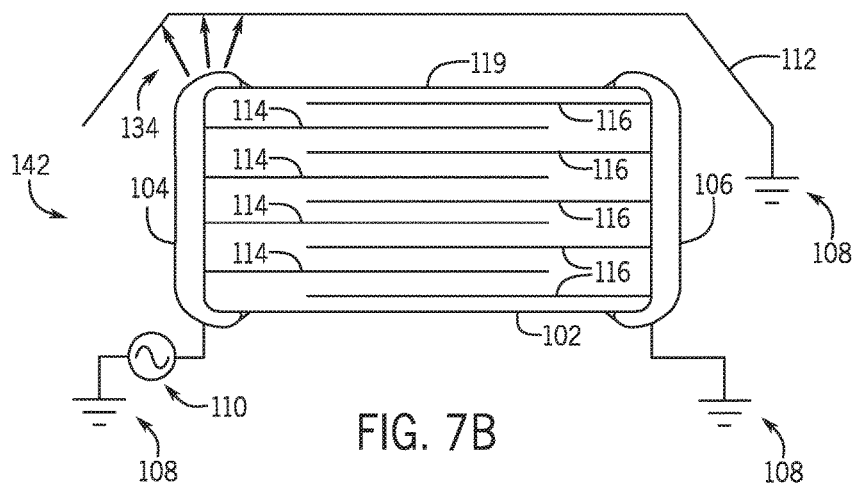
FIG. 7B is a schematic diagram of an electronic device, such as the device of FIG. 1, and may include an attached capacitor with horizontal electrodes in proximity to an attached shield structure, in accordance with an embodiment.

As discussed above, electronic devices 10A, 10B, 10C, 10D, and 10E described above may include shielding structures as part of the enclosures 36, or as an internal structure coupled to the circuit boards. The shielding structures may be close to components of the circuit board. FIGS. 7A and 7B illustrate a capacitor 102 with symmetric electrodes that may be arranged to reduce parasitic capacitances by using markings, as discussed below. Diagram 100 in FIG. 7A provides a schematic illustration of a capacitor 102 that may be coupled to a circuit board (not shown) via a signal terminal 104 and a ground terminal 106. Ground terminal 106 may be coupled to a ground 108 of the electrical device, and signal terminal 104 may receive a signal from circuitry 110. Diagram 100 also includes a shield lid 112 that may also be coupled to the ground 108. Capacitor 102 may have signal electrodes 114, which are coupled to the signal terminal 104, and ground electrodes 116, which are coupled to ground terminal 106. The capacitive coupling between signal electrodes 114 and ground electrodes 116 through dielectric material 118 may create the capacitance between the signal terminal 104 and ground terminal 106.

In diagram 100, signal electrodes 114 are closer to the top side 119 of the capacitor 102 (e.g., the top wall of capacitor 102 closer to shield lid 112). As discussed above, in compact electrical device, the distance between the shield lid 112 and the top side 119 may be small enough to create a parasitic capacitance 132 between the top signal electrode 114 and the shield lid 112. Furthermore, parasitic capacitance 134 may also be formed between the signal terminal 104 and the shield lid. Parasitic capacitances 132 and 134 may change the total capacitance between the signal terminal 104 and the ground terminal 106, such that the effective capacitance becomes substantially different from the nominal capacitance of capacitor 102. This change may be unknown during design of the circuit, leading to potential unreliability in the circuitry.

Diagram 142 in FIG. 7B provides a schematic illustration of the capacitor 102 coupled in a manner that may reduce certain parasitic capacitances. As in diagram 100, capacitor 102 in diagram 142 may have a signal terminal 104 and a ground terminal 106 which may be coupled to circuitry 110 and ground 108, respectively. Diagram 142 also illustrates the shield lid 112 that is coupled to ground 108. Note, however, that the capacitor 102 is coupled to ground 108 and circuitry 110 such that the internal electrode closest to top side 119 is a ground electrode 116, contrasting with diagram 100, in which the signal electrode 114 is disposed closest to the top side 119. As a result, the parasitic capacitance 132 of diagram 100 does not appear in diagram 142. While parasitic capacitance 134 between signal terminal and shield lid 112 may still be present, the overall parasitic impedance may be substantially reduced. Thus, coupling the capacitor to the circuit board such that the internal electrode closest to a shielding structure is a ground electrode results in a capacitance between signal terminal 104 and ground terminal 106 that may be much closer to the nominal.

Capacitor 102 may have a marking to denote that which terminal should be used as ground terminal 106. Markings may also be incorporated to the capacitor 102 to indicate a top side that is adjacent to a ground electrode 116, to mitigate parasitic capacitances as discussed above. In certain embodiments, such as the one illustrated in 102, ground electrodes may be arranged to be the closest to the top side and to the bottom side. In such case, markings may only provide indication of the orientation of the electrodes (e.g., indications that inform whether the electrodes are in a horizontal or vertical plane). As discussed below, with respect to FIG. 22, the markings may be used to provide a direction and/or orientation while assembling the electronic device.

Figure 8A:
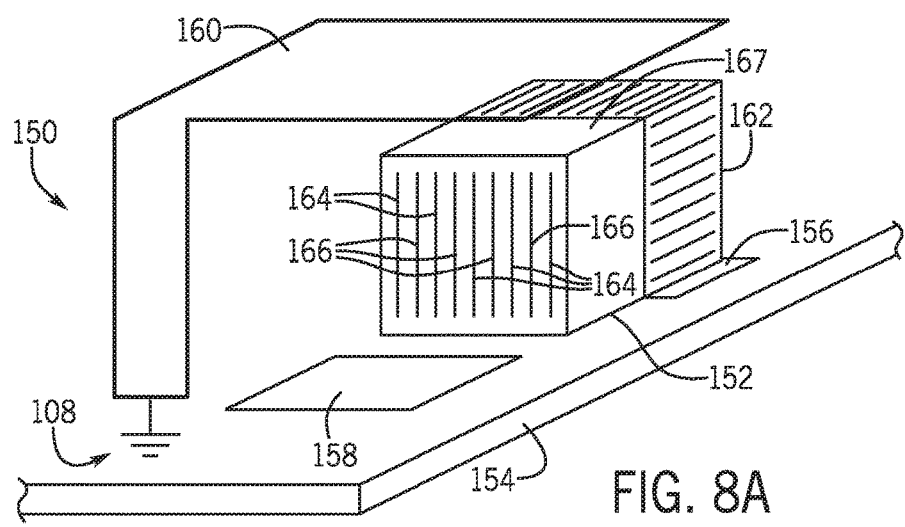
FIG. 8A is an illustration of a circuit board of an electronic device, such as the device of FIG. 1, that is coupled to a shield structure and to a capacitor with vertical electrodes, in accordance with an embodiment.
Figure 8B:
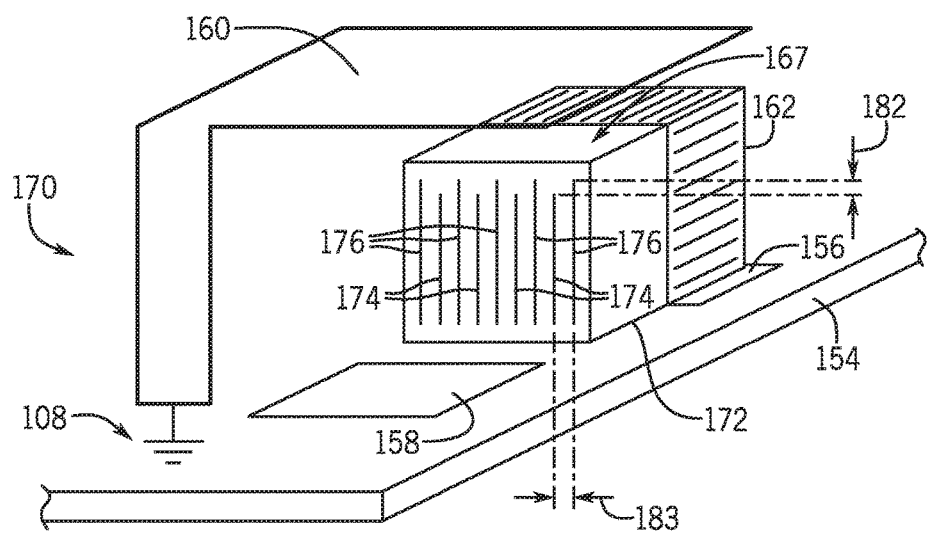
FIG. 8B is an illustration of a circuit board of an electronic device, such as the device of FIG. 1, that is coupled to a shield structure and a to an asymmetric capacitor with vertical electrodes, in accordance with an embodiment.

The above discussion relates to capacitors that may be coupled in a manner that the internal electrodes may be oriented horizontally (e.g., parallel to the circuit board and/or to the shielding lid). Diagrams 150 and 170 in FIG. 8A and FIG. 8B illustrate schematically a capacitor 152 with vertical internal electrodes (e.g., electrodes perpendicular to the circuit board 154 and/or shield lid 160) with even height electrodes and a capacitor 172 with offset electrodes, respectively. In diagram 150, capacitor 152 is coupled to circuit board 154 by a signal pad 156 and a ground pad 158. Capacitor 172 in diagram 170 is similarly coupled to circuit board 154 by a signal pad 156 and a ground pad 158. In the cross-section schematic illustrations of capacitors 152 and 172, signal terminals 162 may be coupled to signal pad 156 and a ground terminal (not shown) may be coupled to the ground pad 158.

The internal structure of the electrodes in the capacitor 152 in FIG. 7A is such that the distance between the top of the electrodes (e.g., the edge of the electrode closes to the top side 167 that is closes to the shield lid 160) is substantially similar between signal electrodes 164 and ground electrodes 166. By contrast, the internal structure of the electrodes in the capacitor 172 is such that the smallest perpendicular distance between the top side 167 and the top of the signal electrodes 174 is larger than the smallest perpendicular distance between the top side 167 and the top of the ground electrodes 176 by an offset distance 182. As discussed above, the resulting increase in the distance between signal electrodes 174 and the shield lid 160 relative to the distance between ground electrodes 176 and shield lid 160 may lead to a reduction in parasitic performances.

The offset distance 182 may be calculated with respect to an inter-electrode gap 183 that forms the capacitive coupling in the electrode (e.g., the distance between a ground electrode and the closest signal electrode or the distance between a signal electrode and the closest ground electrode). In some embodiments, the offset distance may be 3-4 times larger than the inter-electrode gap 183 to achieve reduction in parasitic performances. The relation between the offset distance 182 and inter-electrode gap 183 may be larger or smaller based on the desired parasitic capacitance mitigation, the dielectric materials, and the actual distance between the capacitor and the shielding frame. As with capacitor 102 discussed above, capacitor 172 may include markings in the external structure to inform which terminal should be used as a signal terminal 162 or a ground terminal, and the location of the top side 167 that should be closest to the shield lid 160.

Descriptions related to views illustrated in FIGS. 9A-G, 11A-F, 13A-C, 14A-F, 16A-G, 18A-F, and 19A-F, may refer to a longitudinal direction 192, a transversal direction 194, and a vertical direction 196. In these descriptions, a vertical plane may refer to a plane parallel to the vertical direction 196, and a horizontal plane may be any plane formed by the longitudinal direction 192 and the transversal direction 194. References to a bottom side or a top side of a capacitor may refer to a region closest to circuit board or farthest from the circuit board when the capacitor is coupled to the circuit board. Note that, while the descriptions may provide references to how a capacitor may be disposed relative to the circuit board or to a shielding structure, one of ordinary skill in the art may make appropriate adjustments in the orientation of the capacitors described herein within electronic devices using the descriptions provided in this specification.

Capacitors 102 and 172 may employ markings to provide orientation information during the assembly. View 200 in FIG. 9A illustrates a capacitor 202 with asymmetric electrodes having ground terminal 204 and signal terminal 206 designed in a manner that may provide orientation information. As illustrated, a clear region 208 adjacent to terminals 204 and 206 may provide orientation information to differentiate the top side 209 from the bottom side 211. Note that both the ground terminal 204 and the signal terminal 206 extend towards the bottom side 211 of the capacitor 202. As such, while attaching capacitor 202 to the circuit board, the clear region 208 may prevent misalignment of the capacitor 202. Capacitor 202 may include a visual marker to differentiate the ground terminal 204 from the signal terminal 206. Moreover the clear region 208 may also reduce parasitic capacitances between the signal terminal 206 and a framing shield, such as parasitic capacitance 134 of FIG. 7A.

The perspective view 210 in FIG. 9B and the perspective view 212 in FIG. 9C illustrate the terminations of the ground electrodes 214 and signal electrodes 216, respectively. The exposed ground electrode 214 terminations shown in view 210 may form direct electrical contact with the ground terminal 204. Similarly, the exposed signal electrode 216 shown in view 212 may form direct electrical contact with the signal terminal 206. Note that a clear region 208 is present above exposed terminations shown in both views 210 and 212, facilitating the design of terminals 204 and 206 discussed above. View 218 in FIG. 9D illustrates a cross-section view of capacitor 202. The cross-section view illustrates the asymmetric design of the ground electrodes 214 relative to the signal electrodes 216. Note that due to the difference in height (i.e., length of the electrode along the vertical direction 196) between the ground electrodes 214 and the signal electrodes 216, the ground electrodes 214 may be generally closer to the top side than the signal electrodes. This difference may result in substantial decrease in parasitic capacitances, as discussed above.

Figure 9E:
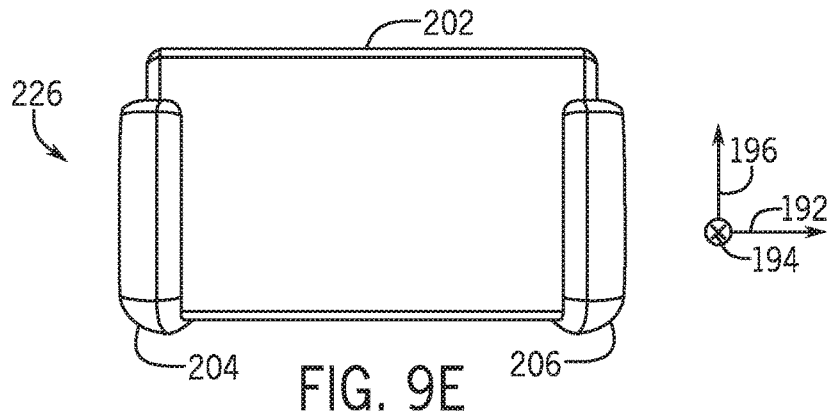
FIG. 9E is a front view of the capacitor of FIG. 9A, in accordance with an embodiment.
Figure 9F:
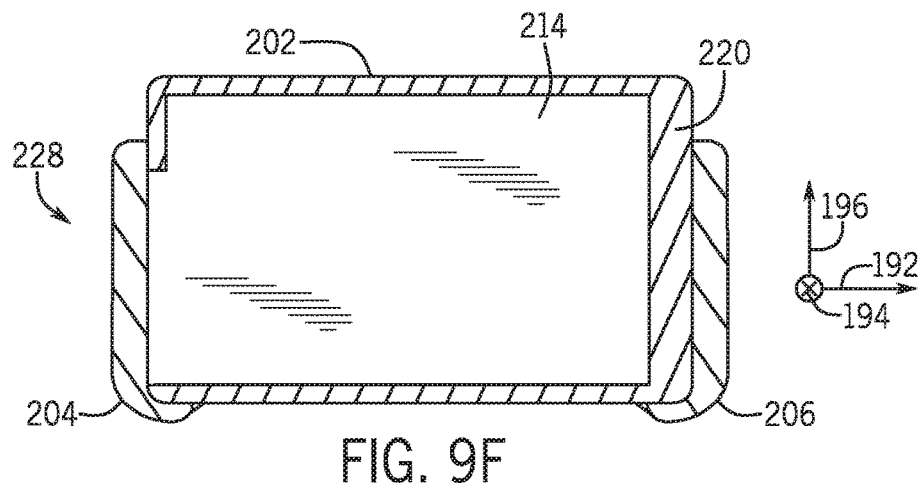
FIG. 9F is a cross-section front view of the capacitor of FIG. 9A illustrating ground electrodes, in accordance with an embodiment.
Figure 9G:
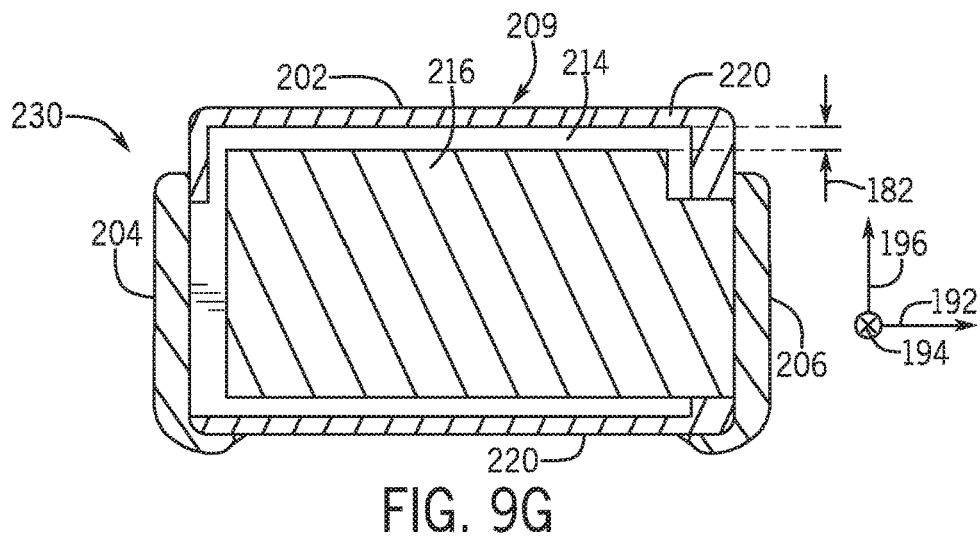
FIG. 9G is another cross-section front view of the capacitor of FIG. 9A illustrating signal electrodes, in accordance with an embodiment.
Figure 10:
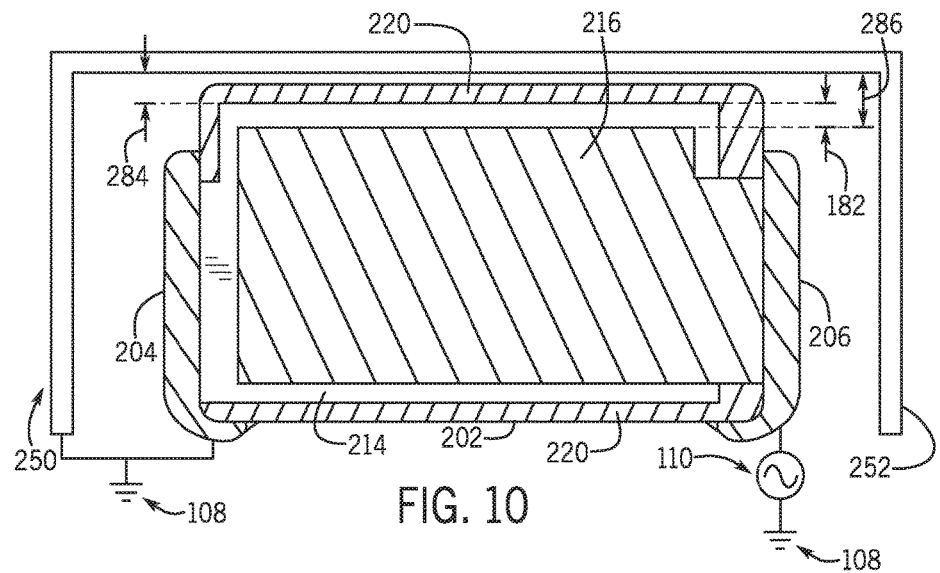
FIG. 10 is a schematic view illustrating the clearances between a shield frame and the electrodes of the capacitor of FIG. 9A, in accordance with an embodiment.

Front views 226, 228 and 230 of capacitor 202 are provided in FIGS. 9E, 9F, and 9G, respectively. View 228 is a cross-section front view that illustrates the ground electrode 214, while view 230 is a cross-section view that illustrates the signal electrode 216. A ground electrode 214 is also shown in view 230 as a reference. As discussed above with respect to view 218, signal electrode 216 may have a smaller height than ground electrode 214 by an offset distance 182. Moreover, the top of the ground electrode 214 may be closest to the top side 209 of capacitor 202. As discussed above, this geometry may reduce the parasitic capacitance between signal electrode 216 and a shielding structure. This effect is further illustrated in the schematic diagram 250 illustrated in FIG. 10. Schematic diagram 250 illustrates the capacitor 202 coupled via ground terminal 204 to the ground 108 and via signal terminal 206 to circuitry 110 that provides a signal. The diagram further illustrates a grounded shield frame 252 coupled to ground 108. As illustrated, the presence of an offset distance 182 makes the distance 284 between the top of ground electrode 214 to the shield frame 252 larger than the distance 286 between the top of the signal electrode 216 and the shield frame 252, leading to reduction in parasitic capacitances between signal electrodes 216 and shield frame 252.

In capacitor 202, the exposed electrode terminations, as illustrated in views 210 in FIG. 9B and 212 in FIG. 9C, are placed in the side of the capacitor. View 300 of in FIG. 11A illustrates a capacitor 302 with asymmetric electrodes that may have part of their coupling to the terminals along the bottom side 311 of the capacitor. As in capacitor 202 discussed above, capacitor 302 may have a clear region 308 adjacent to ground terminal 304 and signal terminal 306. The clear region may provide orientation information to differentiate the top side 309 from the bottom side 311. As a result of the clear region 308, the capacitor 302 may be properly aligned when coupled to circuit board. Capacitor 302 may include a visual marker to differentiate the ground terminal 304 from the signal terminal 306 to further facilitate coupling. The clear region 308 may also reduce parasitic capacitances between the signal terminal 306 and a framing shield, such as parasitic capacitance 134 of FIG. 7A.

Both the ground terminal 304 and the signal terminal 306 extend towards the bottom side 311 of the capacitor 302. As shown in the perspective view 310 in FIG. 11B, the terminations of the ground electrodes 314 and signal electrodes 316 also extend towards the bottom side 311 of the capacitor. The exposed ground electrode 314 terminations shown in view 310 may form direct electrical contact with the ground terminal 304. Similarly, view 310 shows exposed signal electrode 316, which may form direct electrical contact with the signal terminal 306. View 318 in FIG. 11C illustrates a cross-section view of capacitor 302. The cross-section view illustrates the asymmetric design of the ground electrodes 314 relative to the signal electrodes 316. Note that due to the difference in height (i.e., length of the electrode along the vertical direction 196) between the ground electrodes 314 and the signal electrodes 316, the ground electrodes 314 may be generally closer to the top side 309 of the capacitor 302 than the signal electrodes 316. This difference may result in substantial decrease in parasitic capacitances, as discussed above.

Figure 12:
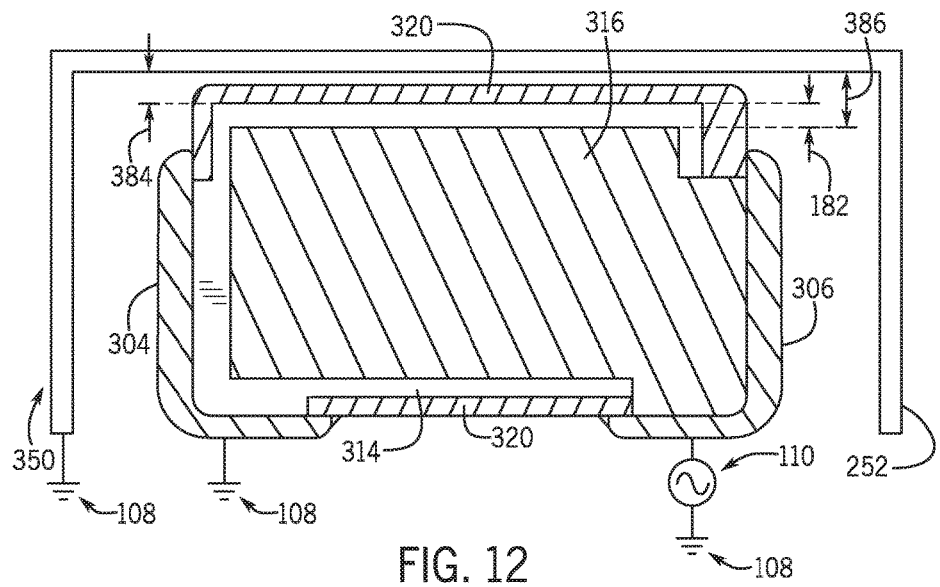
FIG. 12 is a schematic view illustrating the clearances between a shield frame and the electrodes and the terminals of a capacitor of FIG. 11A, in accordance with an embodiment.
Figure 11D:
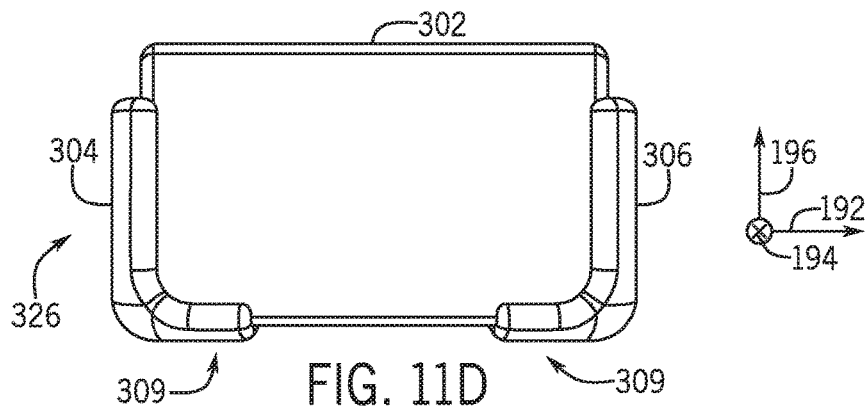
FIG. 11D is a front view of the capacitor of FIG. 12A, in accordance with an embodiment.
Figure 11E:
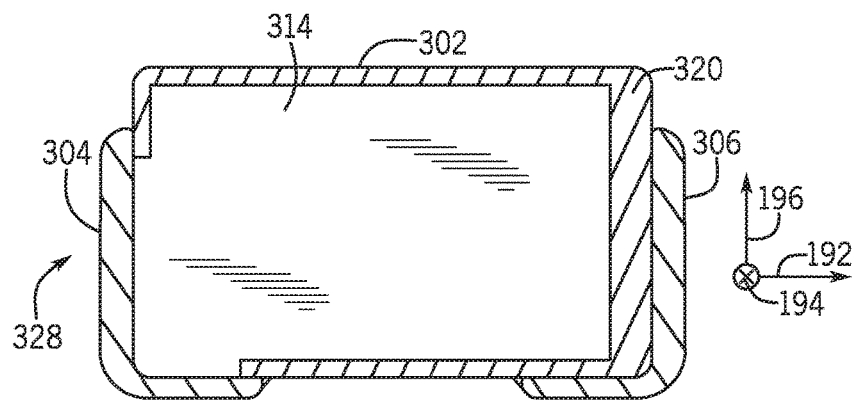
FIG. 11E is a cross-section front view of the capacitor of FIG. 12A illustrating ground electrodes, in accordance with an embodiment.
Figure 11F:
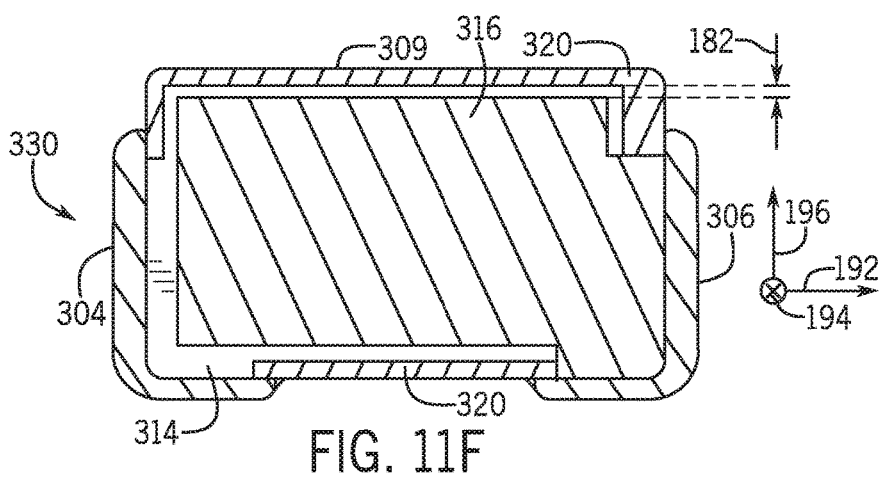
FIG. 11F is another cross-section front view of the capacitor of FIG. 12A illustrating signal electrodes, in accordance with an embodiment.

Front views 326, 328 and 330 of capacitor 302 are provided in FIGS. 11D, 11E, and 11F, respectively. View 328 is a cross-section front view that illustrates the ground electrode 314, while view 330 is a cross-section view that illustrates the signal electrode 316. A ground electrode 314 is also shown in view 330 as a reference. As discussed above with respect to view 318, signal electrode 316 may have a smaller height than ground electrode 314. As a result, the top of ground electrode 314 may be closest to the top side 309 of capacitor 302, by an offset distance 182. As discussed above, this geometry may reduce the parasitic capacitance between signal electrode 316 and a shielding structure. This effect is further illustrated in the schematic diagram 350 illustrated in FIG. 12. Schematic diagram 350 illustrates the capacitor 302 coupled via ground terminal 304 to the ground 108 and via signal terminal 306 to circuitry 110 that provides a signal. The diagram further illustrates a grounded shield frame 252 coupled to ground 108. As illustrated, the presence of an offset distance 182 makes the distance 384 between the top of ground electrode 314 to the shield frame 252 larger than the distance 386 between the top of the signal electrode 316 and the shield frame 252, leading to reduction in parasitic capacitances between signal electrodes 316 and shield frame 252.

Figure 13A:
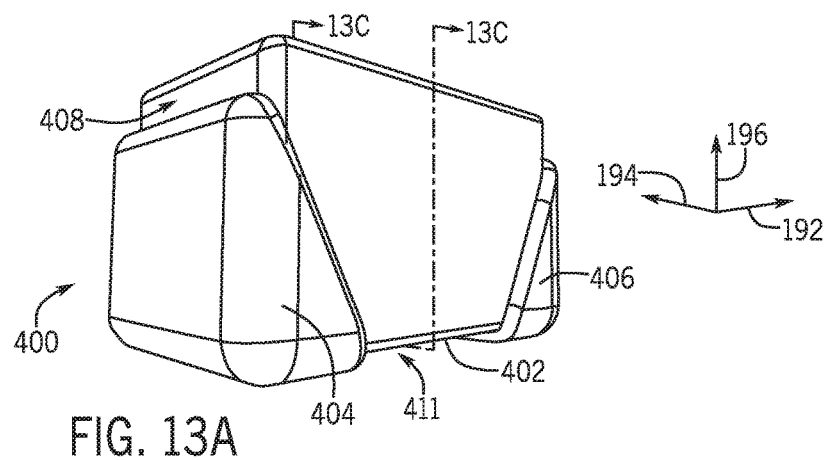
FIG. 13A is a perspective view of an embodiment of a capacitor with asymmetric electrodes triangular terminals.
Figure 13B:
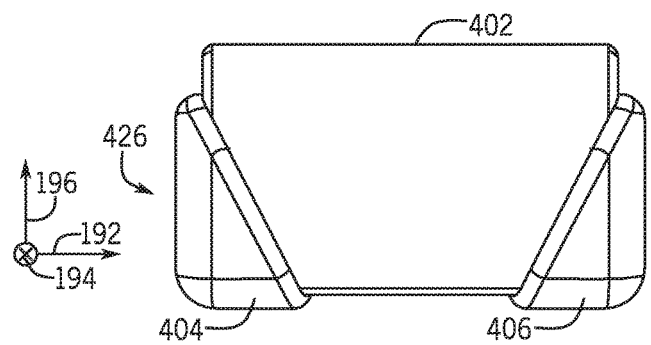
FIG. 13B is a front view of the capacitor of FIG. 13A, in accordance with an embodiment.
Figure 13C:
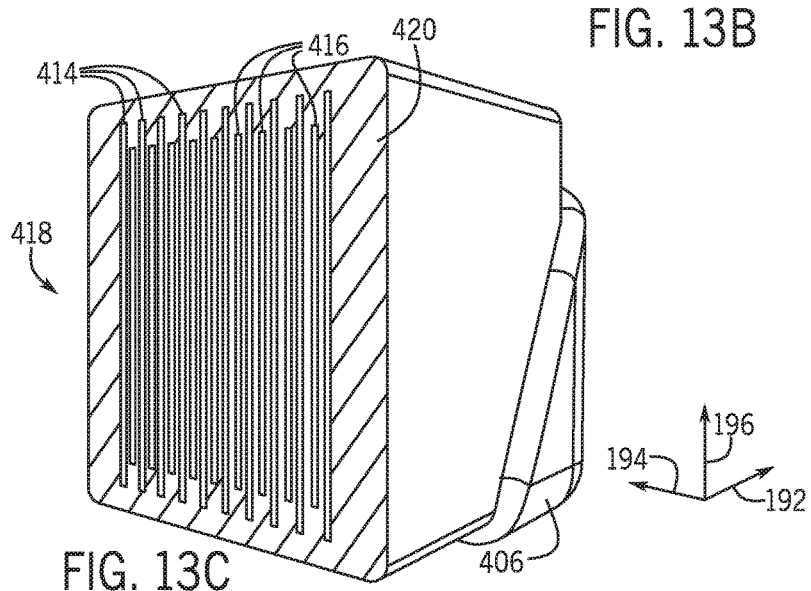
FIG. 13C is a cross-section perspective view of the capacitor of FIG. 13A, in accordance with an embodiment.

The capacitors 202 of FIG. 9A and 302 of FIG. 11A have terminals that covering portions of the terminal side and the bottom side. Fabrication of each terminal may employ a two-step process, one for covering each side. View 400 in FIG. 13A illustrates a capacitor 402 with terminals in a triangular shape that may be formed with a one-step process. The ground terminal 404 and the signal terminal 406 are formed along edges of the bottom side 411 of the capacitor 402 leaving a clear region 408 along the edges of the top side 409. Capacitor 402 may include a visual marker to differentiate the ground terminal 404 from the signal terminal 406. Moreover the clear region 408 may also reduce parasitic capacitances between the signal terminal 406 and a framing shield, such as the parasitic capacitance 134 of FIG. 7A. The triangular shape of ground terminal 404 and signal terminal 406 is also illustrated in the front view 426 in FIG. 13B. The cross-section view 418 of FIG. 13C illustrates the asymmetric design of the ground electrodes 414 relative to the signal electrodes 416. Note that due to the difference in height (i.e., length of the electrode along the vertical direction 196) between the ground electrodes 414 and the signal electrodes 416, the ground electrodes 414 may be generally closer to the top side than the signal electrodes, resulting in reduced parasitic capacitances, as discussed above.

It should be understood that capacitor 402 may be configured such that the ground electrodes 414 are similar shape to the ground electrodes 214 of capacitor 202 or the ground electrodes 314 of capacitor 302. Similarly, signal electrodes 416 may be configured to have a similar shape to the signal electrodes 216 of capacitor 202 or the signal electrode 316 of capacitor 302. Terminals 404 and/or 406 may be coupled to exposed electrode terminations disposed in a perpendicular site of the capacitor, as illustrated in views 210 and 212, or in the perpendicular and bottom sides of the capacitor, as illustrated in view 310.

Figure 14A:
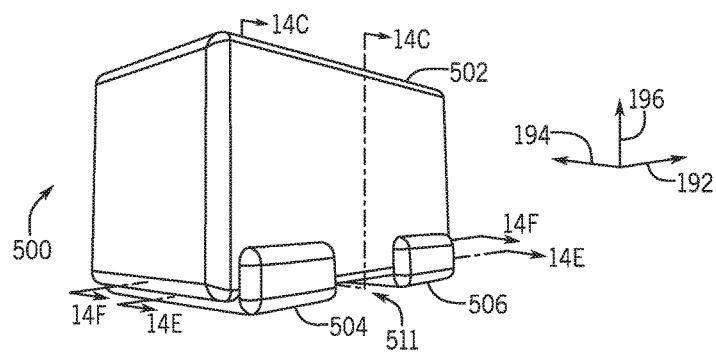
FIG. 14A is a perspective view of an embodiment of a capacitor with asymmetric electrodes and bottom-only terminals.
Figure 14B:
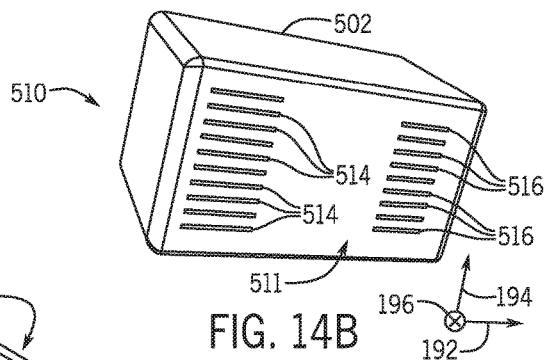
FIG. 14B is a bottom perspective view of the capacitor illustrating electrode terminations of FIG. 14A, in accordance with an embodiment.

Capacitors with asymmetric electrode designs may be constructed with bottom side only terminations. View 500 of in FIG. 14A illustrates a capacitor 502 with asymmetric electrodes that may have bottom-only terminals. In capacitor 502, both the ground terminal 504 and signal terminal 506 are disposed in the bottom side 511 of the capacitor 502, which enforces the orientation of the capacitor 502 during coupling to the circuit board. Visual markers may be used to differentiate ground terminal 504 from signal terminal 506. The placement of the terminals of capacitor 502 in the bottom side 511 may also reduce parasitic capacitance between the signal terminal 506 and shielding structure, as discussed with respect to FIG. 15. The perspective view 510 in FIG. 14B illustrates the terminations of the ground electrodes 514 and signal electrodes 516 in the bottom side 511 of the capacitor. The exposed electrode terminations shown in view 510 may form direct electrical contact with the ground electrode 504 and signal terminal 506.

Figure 14C:
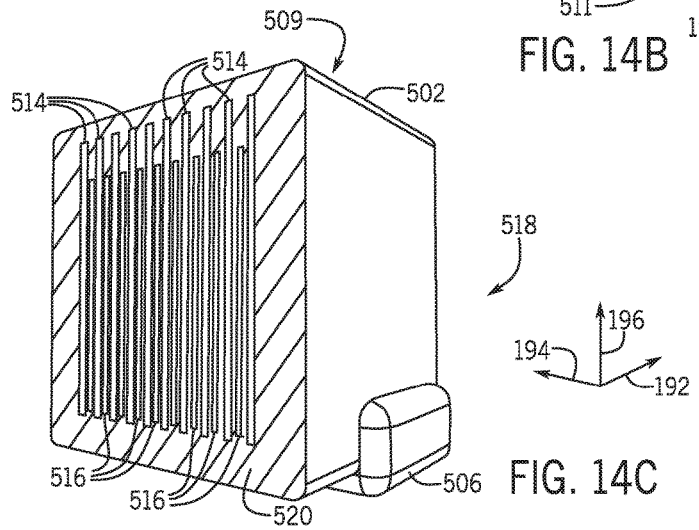
FIG. 14C is a cross section perspective view of the capacitor of FIG. 14A, in accordance with an embodiment.
Figure 14D:
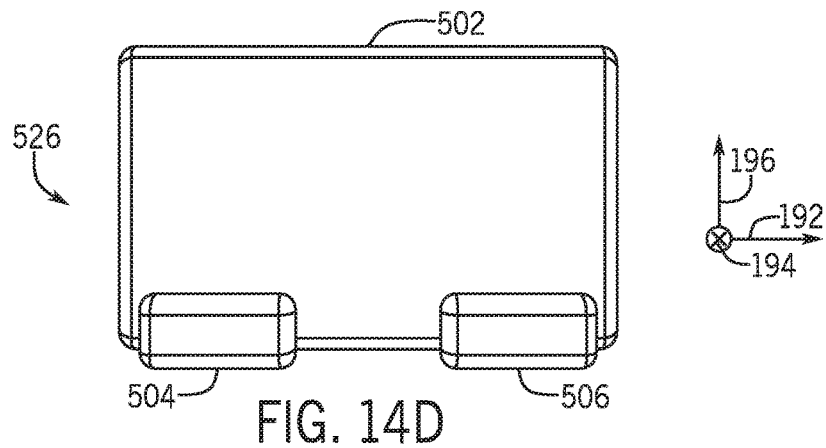
FIG. 14D is a front view of the capacitor of FIG. 14A, in accordance with an embodiment.
Figure 14E:
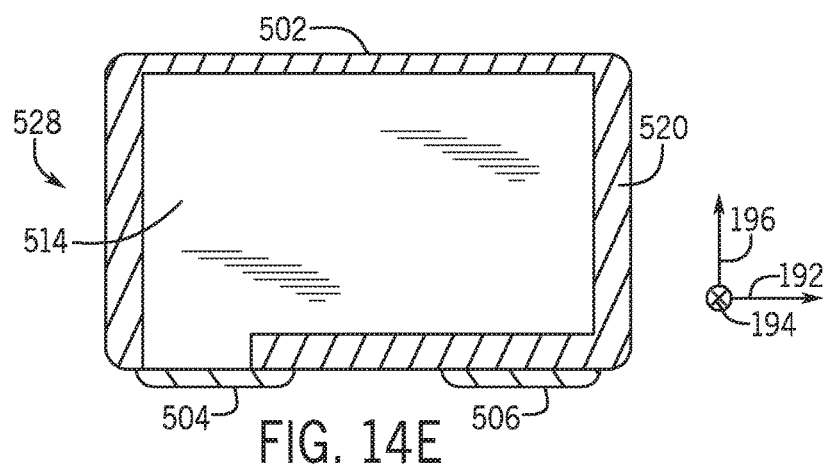
FIG. 14E is a cross-section front view of the capacitor of FIG. 14A illustrating a ground electrode, in accordance with an embodiment.
Figure 14F:
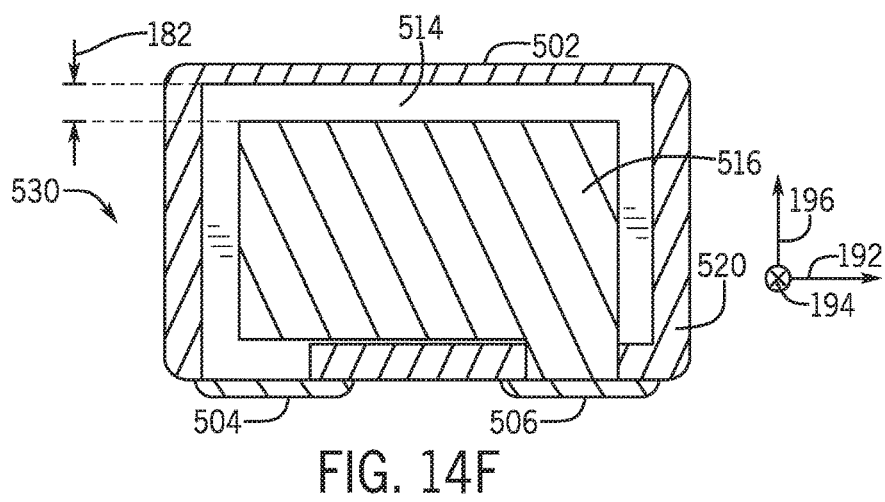
FIG. 14F is another cross-section front view of the capacitor of FIG. 14A illustrating a signal electrode, in accordance with an embodiment.

View 518 in FIG. 14C illustrates a cross-section view of capacitor 502. The cross-section view illustrates the asymmetric design of the ground electrodes 514 relative to the signal electrodes 516. Note that due to the difference in height (i.e., length of the electrode along the vertical direction 196) between the ground electrodes 514 and the signal electrodes 516, the ground electrodes 514 may be generally closer to the top side 509 of the capacitor 502 than the signal electrodes 516. This difference in heights is also illustrated in front views 526, 528 and 530 in FIGS. 14D, 14E, and 14F, respectively. View 528 is a cross-section front view that illustrates the ground electrode 514, while view 530 is a cross-section view that illustrates the signal electrode 516. A ground electrode 514 is also shown in view 530 as a reference. As discussed above with respect to view 518, signal electrode 516 may have a smaller height than ground electrode 514. As a result, the top of electrode 514 may be closest to the top side 509 of capacitor 502 by an offset distance 182. As discussed above, this geometry may reduce the parasitic capacitance between signal electrode 516 and a shielding structure.

Figure 15:
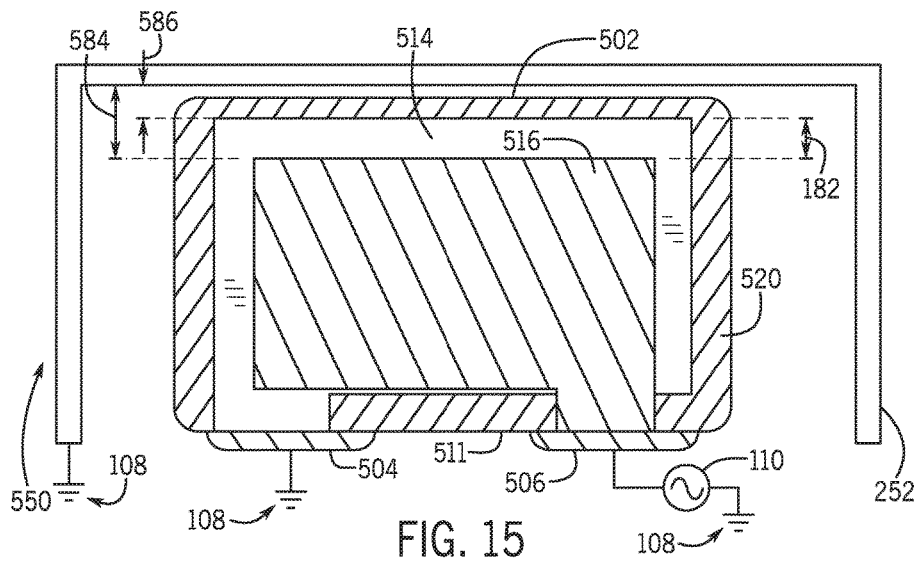
FIG. 15 is s a schematic view illustrating the clearances between a shield frame and the electrodes and the terminals of the capacitor of FIG. 14A, in accordance with an embodiment.

The above discussed effect is further illustrated in the schematic diagram 550 illustrated in FIG. 15. Schematic diagram 550 illustrates the capacitor 502 coupled via ground terminal 504 to the ground 108 and via signal terminal 506 to circuitry 110 that provides a signal. The diagram further illustrates a grounded shield frame 252 coupled to the ground 108. As illustrated, the presence of an offset distance 182 makes the distance 584 between the top of ground electrode 514 to the shield frame 252 larger than the distance 586 between the top of the signal electrode 516 and the shield frame 252, leading to reduction in parasitic capacitances between signal electrodes 516 and shield frame 252. By placing the signal terminal 506 in the bottom side 511, without portions on a vertical side of the capacitor, parasitic capacitance between the signal terminal 506 and the grounded shield frame 252 (e.g., parasitic capacitance 134 of FIG. 7A) is also mitigated. As a result, capacitor 502 may suffer from substantially less parasitic capacitances when placed near shielding structures.

In certain situations, placement of the signal terminal in the bottom side may be sufficient to reduce the parasitic capacitances with shielding structures discussed herein, and the ground terminals may be placed along the vertical sides of the capacitor. View 600 of in FIG. 16A illustrates a capacitor 602 that may have its ground terminals 604A and 604B placed along the vertical sides, and its signal terminal 606 placed in the bottom side 611. The position of the signal terminal 606 in the bottom side 611 may enforce the orientation of the capacitor 602 with respect to the circuit board during assembly. In the capacitor 602, the distinct placement of ground terminals 604A and 604B with respect to signal terminal 606 provides differentiation between the terminals, and thus capacitor 602 may be properly coupled without visual markers to differentiate ground from signal terminal. It should be understood that a circuit board employing a capacitor such as capacitor 602 should be by placing the connectors (e.g., pads) in a manner that corresponds to disposition of the ground terminals 604A and 604B and of the signal terminal 606. The perspective view 610 in FIG. 16B and the perspective view 612 in FIG. 16C illustrate the exposed terminations of the ground electrodes 614 and signal electrodes 616. The exposed terminations of the ground electrodes 614 are placed along the vertical sides of the capacitor, and may form direct electrical contact with ground terminals 604A (view 610) and 604B (view 612). The exposed electrode terminations of the signal electrode 616 appear in the bottom side 611, and may form direct electrical contact with the signal terminal 606.

Figure 17:
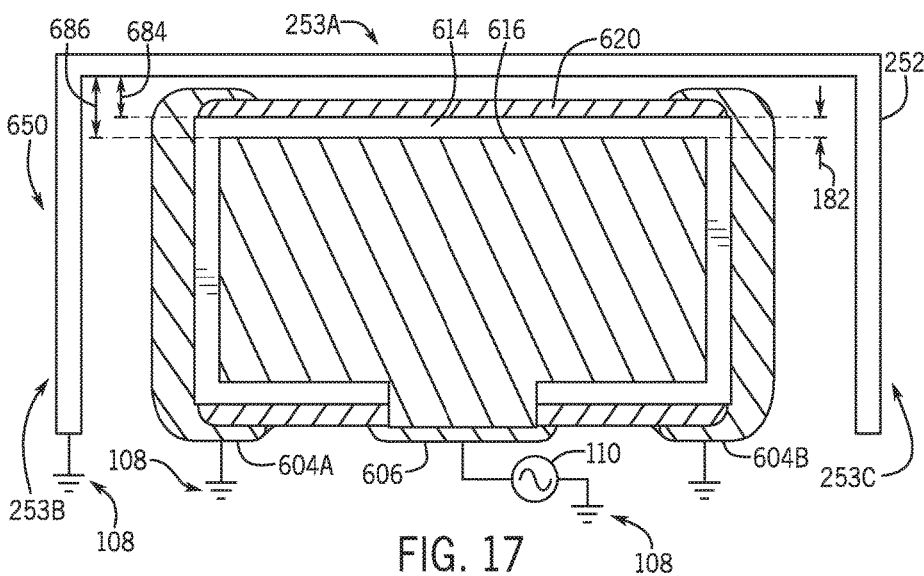
FIG. 17 is a schematic view illustrating the clearances between a shield frame and the electrodes of the capacitor of FIG. 16A, in accordance with an embodiment.
Figure 16E:
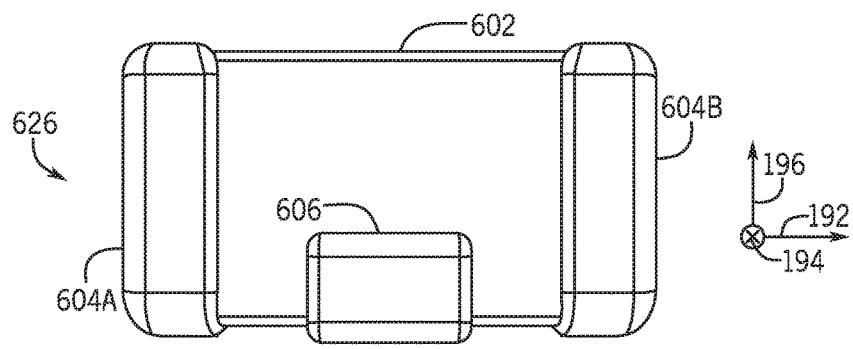
FIG. 16E is a a front view of the capacitor of FIG. 16A, in accordance with an embodiment.
Figure 16F:
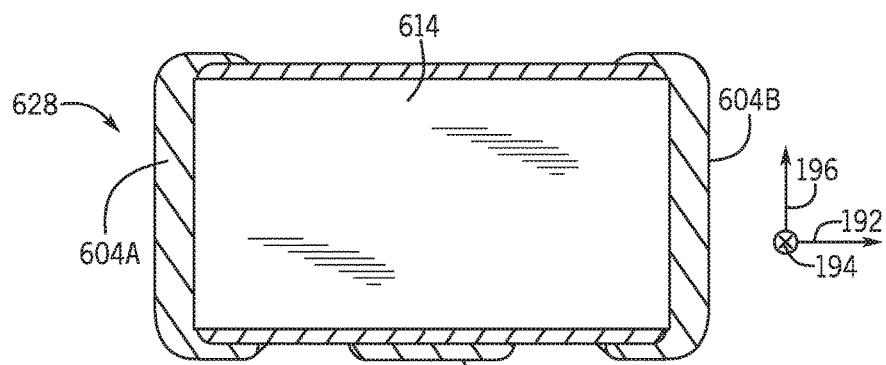
FIG. 16F is a cross-section front view of the capacitor of FIG. 16A illustrating a ground electrode, in accordance with an embodiment.
Figure 16G:
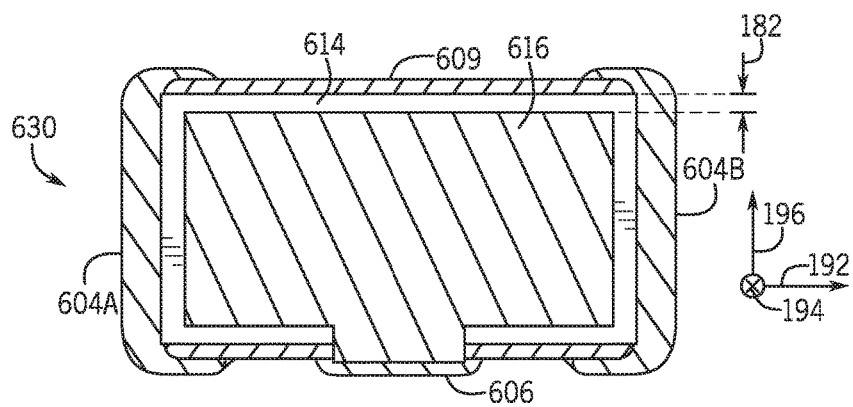
FIG. 16G is a cross-section front view of the capacitor of FIG. 16A illustrating a signal electrode, in accordance with an embodiment.

View 618 in FIG. 16D illustrates a cross-section view of capacitor 602. The cross-section view 618 is taken along a vertical plane that crosses the signal terminal 606. In this vertical plane, the contact between signal electrodes 616 and the signal terminal 606 is shown in the bottom side. Note that the ground electrodes 614 do not contact the signal terminal 606. View 618 also illustrates the offset design between the top of the ground electrodes 614 and the top of the signal electrodes 616. As illustrated, the top of the ground electrodes 614 are closer to the top side 609 of the capacitor 602 than the signal electrodes 616. This difference in heights is also illustrated in front views 626, 628 and 630 in FIGS. 16E, 16F, and 16G, respectively. View 628 is a cross-section front view that illustrates the ground electrode 614, while view 630 is a cross-section view that illustrates the signal electrode 616, with ground electrode 614 shown as reference. As discussed above with respect to view 618, signal electrode 616 may have a smaller height than ground electrode 614. As a result, the top of ground electrode 614 may be closest to the top side 609 of capacitor 602 by an offset distance 182. The schematic diagram 650 illustrated in FIG. 17 illustrates how the design of capacitor 602 may reduce the parasitic capacitances between signal terminal 606 and/or signal electrodes 616 and a grounded shield frame 252. The schematic diagram 650 illustrates the capacitor 602 coupled via ground terminals 604A and 604B to the ground 108 and via signal terminal 606 to circuitry 110 that provides a signal. The diagram further illustrates a grounded shield frame 252 coupled to the ground 108. The offset distance 182 makes the distance 684 between the top of ground electrode 514 to the shield frame 252 larger than the distance 686 between the top of the signal electrode 616 and the top portion 253A of shield frame 252. As a result, the parasitic capacitances between signal electrodes 616 and shield frame 252. Moreover, the ground terminals 604A and 604B are closer to the side portions 253B and 253C of the shield frame 252, relative to signal terminal 606 placed in the bottom side 611 of the capacitor.

Figure 18A:
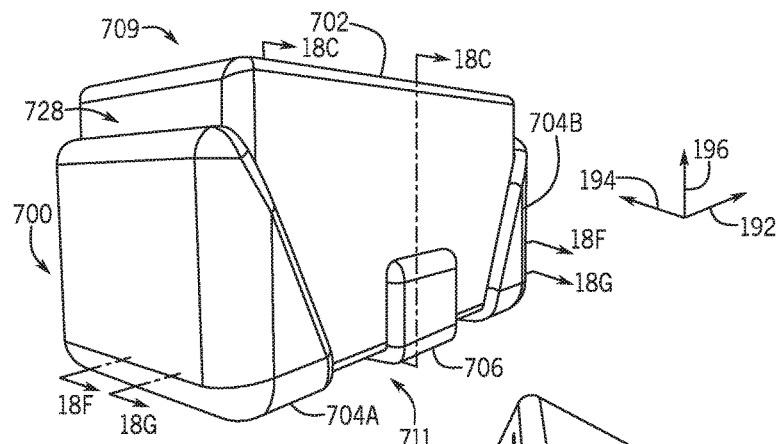
FIG. 18A is a perspective view of an embodiment of a capacitor with asymmetric electrodes and asymmetric terminals.
Figure 18B:
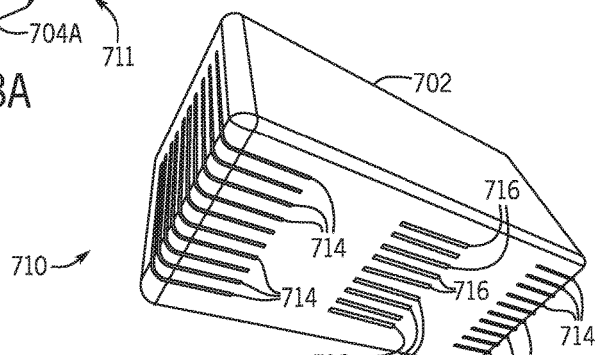
FIG. 18B is a bottom perspective view of the capacitor of FIG. 18A illustrating electrode terminations, in accordance with an embodiment.

A pseudo-shielded capacitor with differentiated signal and ground terminals may also be built by employing a 1-step process for terminal formation. View 700 of in FIG. 18A illustrates a capacitor 702 that may have the ground terminals 704A and 704B with a triangular shape that may be formed with a 1-step process. The signal terminal 706 placed in the bottom side 711, which may enforce the orientation of the capacitor 602 with respect to the circuit board during assembly. In the capacitor 702, the distinct placement of ground terminals 704A and 704B with respect to signal terminal 706 provides differentiation between the signal and ground terminals, and thus capacitor 702 may be properly coupled without need of aid from visual markers. It should be understood that a circuit board employing a capacitor such as capacitor 702 should have its connectors (e.g., pads) placed in a manner that corresponds to disposition of the ground terminals 704A and 704B and of the signal terminal 706. The perspective view 710 in FIG. 18B illustrate the exposed terminations of the ground electrodes 714 and signal electrodes 716. In the capacitor 702, the exposed terminations of the ground electrodes 714 extend from the vertical sides of the capacitor and towards the bottom side 711 of the capacitor, and may form direct electrical contact with the triangular-shaped signal terminals 704A. The exposed electrode terminations of the signal electrode 716 appear in the bottom side 711, and may form direct electrical contact with the signal electrode 706.

Figure 18C:
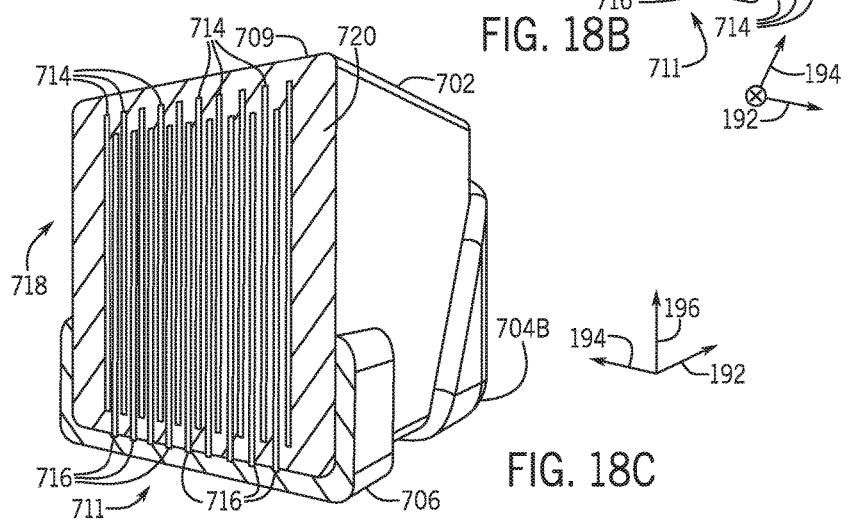
FIG. 18C is a cross-section perspective view of the capacitor of FIG. 18A, in accordance with an embodiment.
Figure 18D:
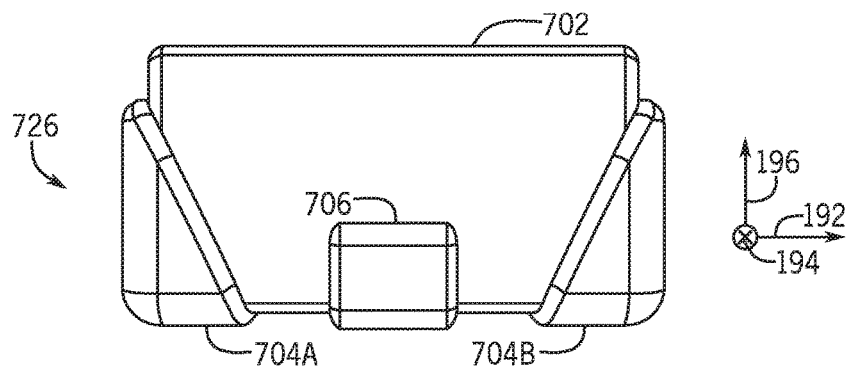
FIG. 18D is a a front view of the capacitor of FIG. 18A, in accordance with an embodiment.
Figure 18E:
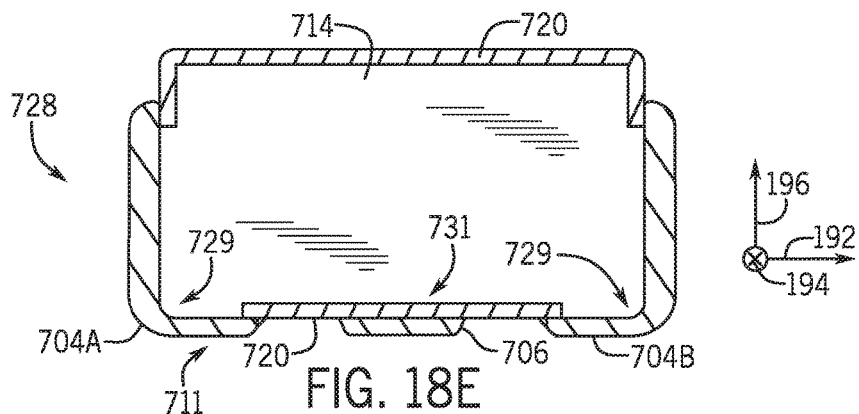
FIG. 18E is a cross-section front view of the capacitor of FIG. 18A illustrating a ground electrode, in accordance with an embodiment.
Figure 18F:
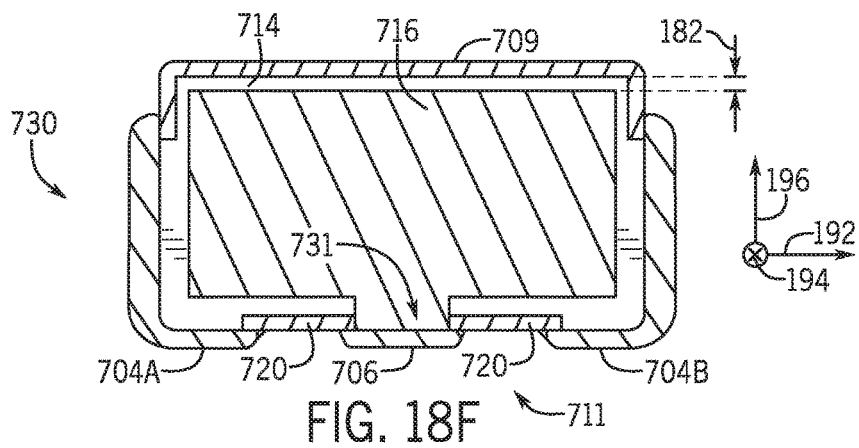
FIG. 18F is a cross-section front view of the capacitor of FIG. 18A illustrating a signal electrode, in accordance with an embodiment.

View 718 in FIG. 18C illustrates a cross-section view of capacitor 702. The cross-section view 718 is taken along a vertical plane that crosses the signal terminal 706. In this vertical plane, the contact between signal electrodes 716 and the signal terminal 706 is shown in the bottom side. Note that the ground electrodes 714 do not contact the signal terminal 706 in this cross-section. Note that the ground electrodes 714 may contact the bottom side 711 of the capacitor 702 in the regions covered by ground terminals 704A and 704B, as illustrated in FIGS. 18E and 18F discussed below. View 718 also illustrates the offset design between the top of the ground electrodes 714 and the top of the signal electrodes 716. As illustrated, the top of the ground electrodes 714 are closer to the top side 709 of the capacitor 702 than the signal electrodes 716. This difference in heights is also illustrated in front views 726, 728 and 730 in FIGS. 18D, 18E, and 18F, respectively. View 728 is a cross-section front view that illustrates the ground electrode 714, while view 730 is a cross-section view that illustrates the signal electrode 716, with ground electrode 714 shown as reference. Note that the ground electrode 714 makes contact with ground terminals 704A and 704B along the edge regions 729 of the bottom side 711 of the capacitor 702, while the signal electrode makes contact with the signal terminal 706 along a central region 731 of the bottom side 711 of the capacitor 702. Moreover, note that the top of ground electrode 714 may be closest to the top side 709 of capacitor 702 by an offset distance 182.

Figure 19A:
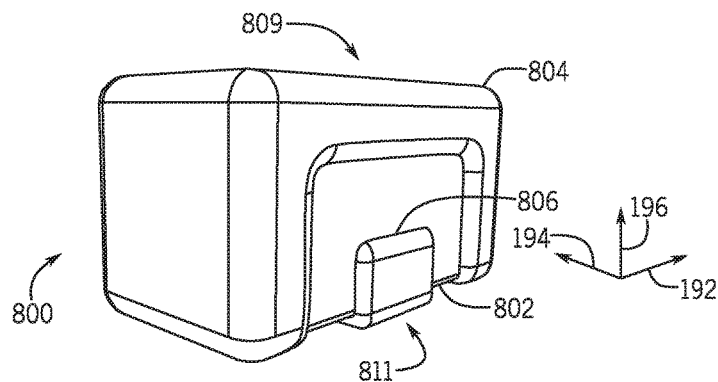
FIG. 19A is a perspective view of an embodiment of a capacitor with asymmetric electrodes and a shielding ground termination.
Figure 19B:
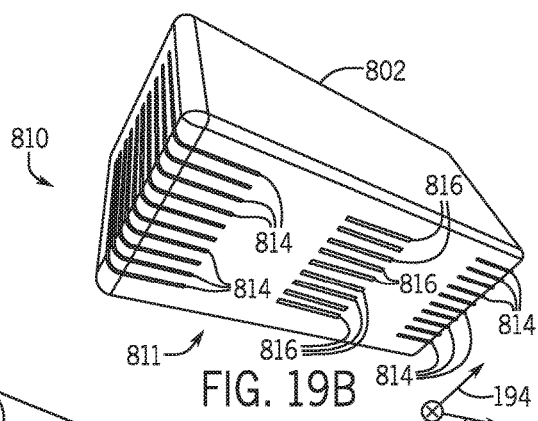
FIG. 19B is a bottom perspective view of the capacitor of FIG. 19A illustrating electrode terminations, in accordance with an embodiment.
Figure 19C:
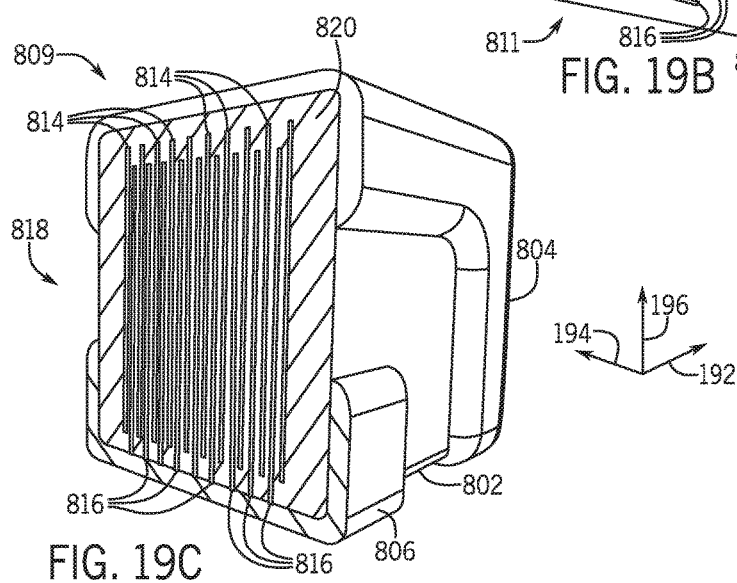
FIG. 19C is a cross-section perspective view of the capacitor of FIG. 19A, in accordance with an embodiment.
Figure 19D:
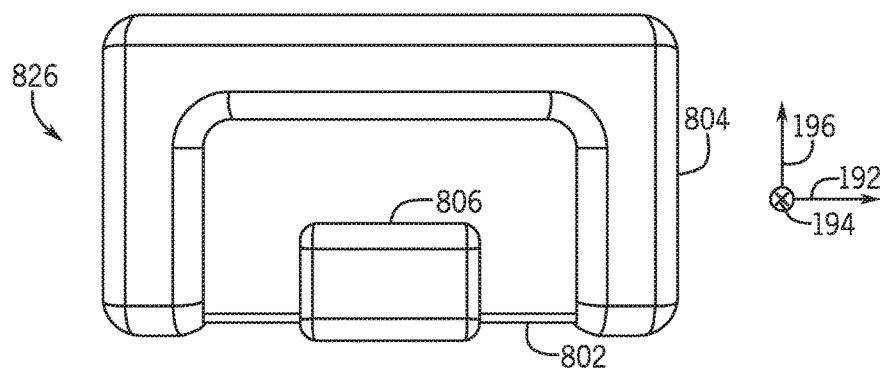
FIG. 19D is a a front view of the capacitor of FIG. 19A, in accordance with an embodiment.
Figure 19E:
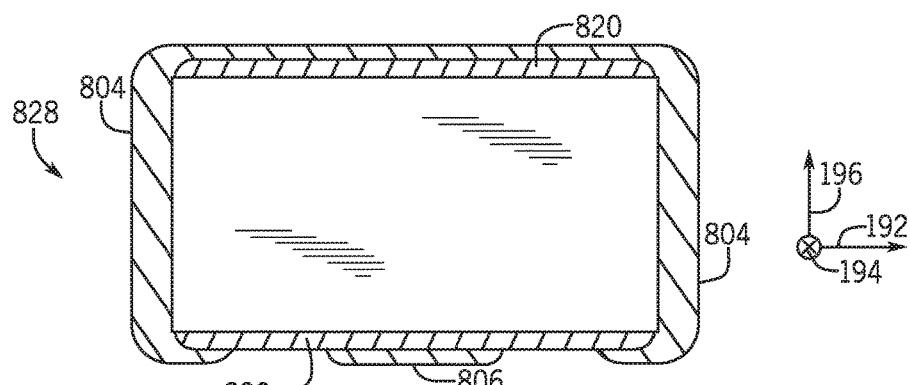
FIG. 19E is a cross-section front view of the capacitor of FIG. 19A illustrating a ground electrode, in accordance with an embodiment.
Figure 19F:
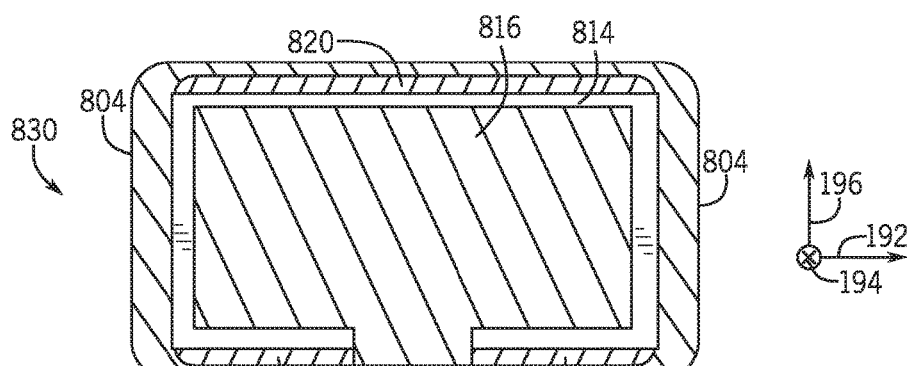
FIG. 19F is a cross-section front view of the capacitor of FIG. 19A illustrating a signal electrode, in accordance with an embodiment.
Figure 20:
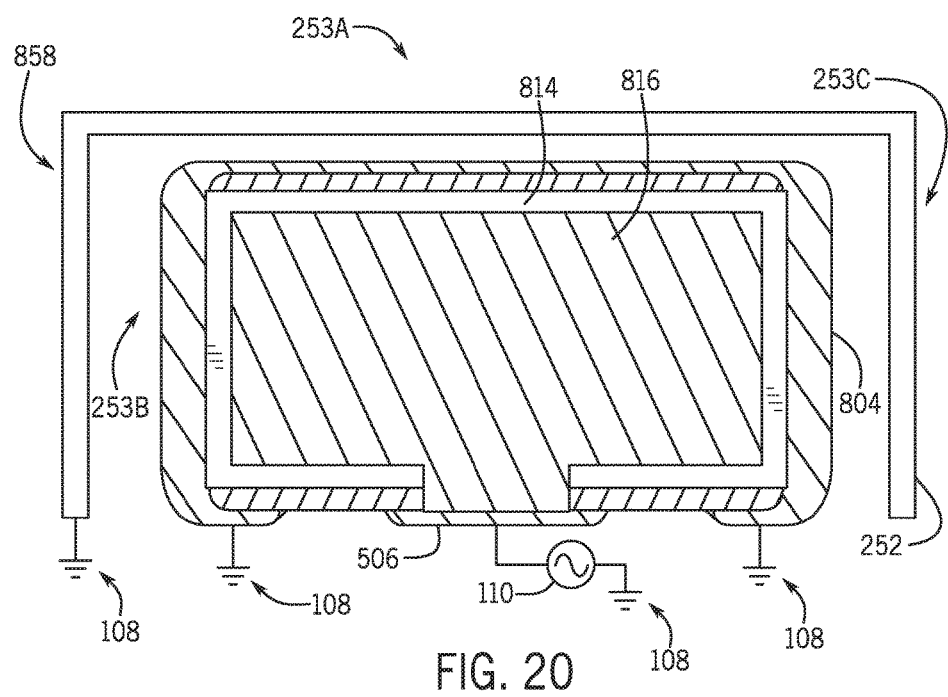
FIG. 20 is a schematic view illustrating the relative position between a shield frame and the ground terminal of the capacitor of FIG. 19A, in accordance with an embodiment.

A pseudo-shielded capacitor may also be designed with a ground terminal that encapsulates a larger section of the capacitor. View 800 of FIG. 19A illustrates a capacitor 802 encapsulated by a ground terminal 804 that extends over the vertical sides and the top 809. The signal terminal 806 is disposed in the bottom side 811 of the capacitor 802. The orientation of the capacitor may during coupling may be determined by the arrangement of ground terminal 804 and signal terminal 806 during assembly. The design of the ground terminal 804 covering an extensive region of the surface of the capacitor 802 may substantially reduce parasitic capacitances between the capacitor 802 and shielding structures, as discussed with respect to FIG. 20. The perspective view 810 in FIG. 19B illustrates the terminations of the ground electrodes 814 and signal electrodes 816 in the bottom side 811 of the capacitor. The exposed electrode terminations for ground electrodes 814 and signal electrodes 816, shown in view 810, may form direct contact with the ground electrode 804 and signal electrode 806, respectively. View 818 in FIG. 19C illustrates a cross-section view of capacitor 802. The cross-section view 818 illustrates the asymmetric design of the ground electrodes 814 relative to the signal electrodes 816. While not illustrated here, in some designs, the ground electrodes 814 may form contact with the ground terminal 804 along the top side 809 of the capacitor 802. Front views 826, 828 and 830 for the capacitor are illustrated in FIGS. 19D, 19E, and 19F, respectively. View 828 is a cross-section front view that illustrates the ground electrode 814, while view 830 is a cross-section view that illustrates the signal electrode 816. A ground electrode 814 is also shown in view 830 as a reference. As discussed above, the encapsulating ground terminal 804 may reduce the parasitic capacitance between the capacitor 802 and a nearby shielding structure 252. This effect is also illustrated in the schematic diagram 850 illustrated in FIG. 20. Schematic diagram 850 illustrates the capacitor 802 coupled via ground terminal 804 to the ground 108 and via signal terminal 806 to circuitry 110 that provides a signal. The diagram further illustrates a grounded shield frame 252 coupled to the ground 108. The encapsulation of the capacitor 802 by the ground terminal 804 prevents formation of capacitive couplings between the grounded shield frame 252 and the signal terminal 806 or any signal electrode 816. As a result, capacitor 802 may not suffer from any parasitic capacitance when placed near shielding structures.

Figure 21:
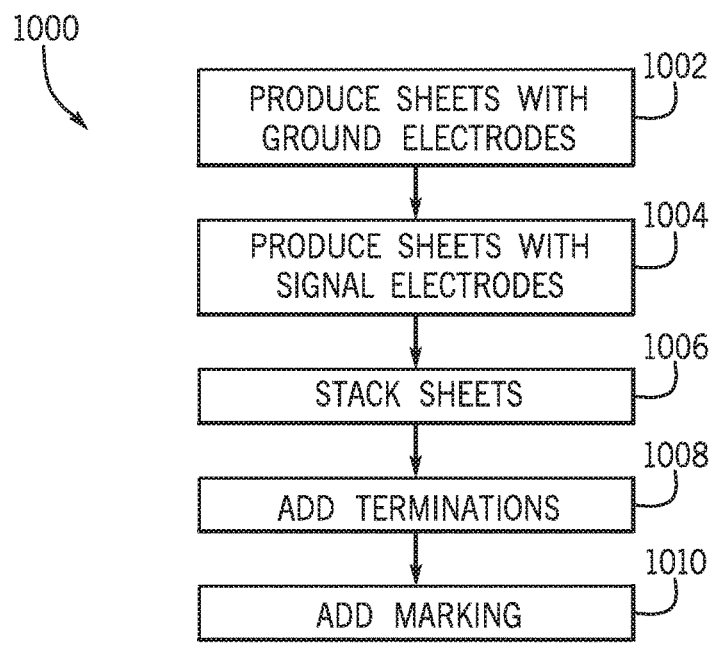
FIG. 21 is a flow chart for a method to produce any of the above-described capacitors, in accordance with an embodiment.

The capacitor devices described above may be produced employing a method 1000 for fabrication of pseudo-shielded capacitor devices from ceramic sheets, illustrated in FIG. 21. The method 1000 may include a process 1002 to produce ceramic sheets having the ground electrodes that may be coupled to a ground terminal. Examples of layouts for ground electrodes include ground electrodes 116, 176, 214, 314, 414, 514, 614, 714, and 814 described above. Method 1000 may also include a process 1004 to produce ceramic sheets having signal electrodes that may be coupled to a signal terminal. Examples of layouts for signal electrodes include signal electrodes 114, 174, 216, 316, 416, 516, 616, 716, and 816 described above. Production of a sheet in processes 1002 and 1004 may take place by stenciling regions in the surface of the ceramic sheets with a conductive material to form the electrodes. Processes 1002 and 1004 may also include adjustments to the ceramic sheets in the appropriate dimensions for assembly of the pseudshielded capacitors. In general, ground electrodes may cover larger areas of the ceramic sheet than the signal electrodes, as discussed above.

Ceramic sheets for the processes described above may be produced from any ceramic materials used to produce multilayer ceramic capacitors. A non-exhaustive list of materials may include titanium dioxide or barium titanate that may or may not be doped, and may have additives such as a zinc, zirconium, magnesium, cobalt, any number of silicates, and/or any number of oxides. In embodiments having class 1 capacitors, type 1 materials such as C0G/NP0 may be used. In embodiments that produce class 2 capacitors, type 2 materials such as X5R may be used. The conductive materials employed in the stenciling process may be copper, nickel, silver, palladium, silver palladium, a copper alloy, a nickel alloy, a silver alloy, or any other appropriate material. Sheets produced by processes 1002 and 1004 may then be arranged in a stack (process 1006). Stacks may be arranged by intercalating ceramic sheets having ground electrodes with ceramic sheets having signal electrodes. The stacks may be pressed to form the body of the capacitor.

Terminals (e.g., signal terminals and ground terminals) may be added to the body of the capacitor in process 1008. Examples of ground terminals include ground terminals 106, 204, 304, 404, 504, 604A, 604B, 704A, 704B, and 804. Examples of signal terminals include signal terminals 104, 162, 206, 306, 406, 506, 606, 606, 706, 706, and 806. Addition of terminals may take place by coating the exposed electrode terminations in the body of the capacitor with a conductive material. Materials for the terminations include, but are not limited to, glass frits mixed with tin, nickel, copper, and silver in any combination. Intermediate conductive layers may also be used.

Certain terminals, such as the triangular shaped terminals 404, 406, 704A, and 704B, may be produced by a 1-step process which includes forming the termination along a single edge of the capacitor body. Markings may also be incorporated to the capacitor body in a process 1010. As discussed above, certain embodiments, including but not limited to, capacitors 102, 172, 202, 302, 402, and 502 may have visual markers added to the surface of the capacitor to indicate the appropriate orientation and/or to differentiate the ground and signal terminals.

Capacitors produced by the above-described method may be class 1 or 2. Class 1 capacitor embodiments may have a rated capacitance in a range from about 0.1 pF to about 33 nF. Class 2 capacitor embodiments may have a rated capacitance in a range from 0.1 µF to 33 µF. The process may be modified to obtain rated capacitances above or below the above-described ranges.

Figure 22:
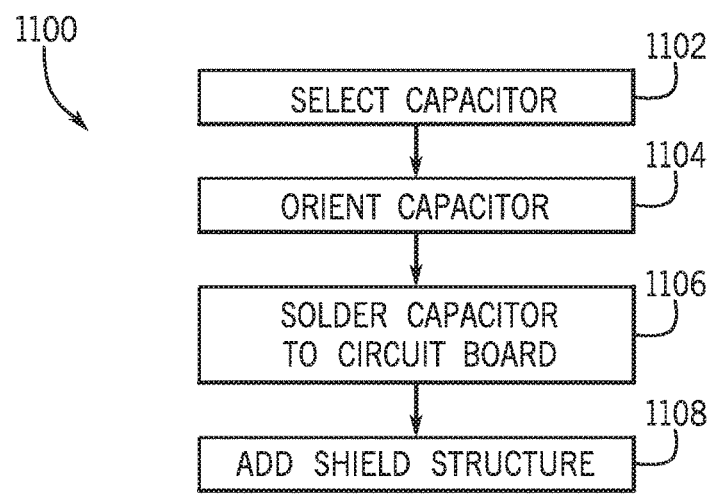
FIG. 22 is a method to couple a capacitor to mitigate parasitic effects, in accordance with an embodiment.

The capacitor devices described above may be incorporated to an electronic device by employing a method 1100 for assembly, as illustrated in FIG. 22. The method may have a process 1102 for selection of the capacitor. The selection of certain characteristics of the capacitor, such as the rated capacitance and the capacitor type and class may be determined by the function of the capacitor, which may take place during design. The selection of the capacitor may also be influenced by physical constraints, such as the footprint available in the circuit board and a distance between the capacitor to the nearby shielding structures. During process 1102, a pseudo-shielded capacitor, such as the capacitors 102, 172, 202, 302, 402, 502, 602, 702, or 808, may be chosen.

During the assembly process, the chosen capacitor may be properly oriented in a process 1104. As discussed above, certain embodiments may have symmetric ground and signal terminals, and thus, orientation may be facilitated by visual markers. The visual markings may be inspected by an automated assembly line making use of computer vision systems. Moreover, orientation may be enforced by robotic actuators, which may be aided by computer vision systems. The properly oriented capacitor may be soldered to the circuit board in a process 1106. During the assembly of the electronic device, the shielding structure may be incorporated.

The use of the method and systems described herein allow compact electronic devices by reducing and/or preventing accidental or parasitic capacitive coupling between capacitors and shielding or grounded structures. Certain embodiments may have increased clearances between electrodes or terminals that receive a signal. Certain embodiments may have ground electrodes or terminals that are placed closer to the shielding structures. In some embodiments, as discussed above, visual markings may be employed to further facilitate use of the systems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A capacitor comprising:
   a ground terminal coupled to a plurality of ground electrodes;
   a signal terminal coupled to a plurality of signal electrodes;
   a bottom side of the capacitor; and
   a top side of the capacitor opposite to the bottom side; and
   wherein the plurality of ground electrodes and the plurality of signal electrodes are disposed perpendicular to the bottom side of the capacitor, a first distance measured as a smallest perpendicular distance between the top side of the capacitor and any ground electrode of the plurality of ground electrodes is smaller than a second distance measured as a smallest perpendicular distance between the top side of the capacitor and any signal electrode of the plurality of signal electrodes.

2. The capacitor of claim 1, comprising a multilayer ceramic capacitor.

3. The capacitor of claim 1, wherein the capacitor comprises a type 1 ceramic material, or a type 2 ceramic material.

4. The capacitor of claim 1, comprising an external visual marking that indicates an orientation of the capacitor.

5. The capacitor of claim 1, comprising an external visual marking that indicates the ground terminal of the capacitor, the signal terminal of the capacitor, or both.

6. The capacitor of claim 1, wherein the plurality of ground electrodes and the plurality of signal electrodes are disposed in parallel to the bottom side of the capacitor, the first distance is measured from a top ground electrode of the plurality of ground electrodes that is closest to the top side of the capacitor, and the second distance is measured from a top signal electrode of the plurality of signal electrodes that is closest to the top side of the capacitor.

7. A capacitor device comprising:
   a top side of the capacitor device;
   a plurality of ground electrodes disposed in a vertical direction, wherein each ground electrode of the plurality of ground electrodes is disposed a first distance from the top side of the capacitor device;
   a ground terminal coupled to the plurality of ground electrodes;
   a plurality of signal electrodes disposed in the vertical direction, wherein each signal electrode of the plurality of signal electrodes is disposed a second distance from the top side of the capacitor device; and
   a signal terminal coupled to the plurality of signal electrodes; and wherein the second distance is smaller than the first distance by an offset distance.

8. The capacitor device of claim 7, wherein each ground electrode of the plurality of ground electrodes is separated from a nearest signal electrode by an inter-electrode gap, and wherein the inter-electrode gap is smaller than the offset distance.

9. The capacitor device of claim 8, wherein the offset distance is at least three times larger than the inter-electrode gap.

10. The capacitor device of claim 7, wherein the ground terminal is disposed along a first vertical side of the capacitor device and comprises an edge between the first vertical side and a bottom side of the capacitor device, and the signal terminal is disposed along a second vertical side of the capacitor device opposite to the first vertical side of the capacitor device and comprises an edge between the second vertical side and the bottom side of the capacitor device.

11. The capacitor device of claim 10, wherein the first vertical side comprises a first uncovered portion of the first vertical side that comprises an edge between the first vertical side and the top side of the capacitor device, and wherein the second vertical side comprises a second uncovered portion of the second vertical side that comprises an edge between the second vertical side and the top side of the capacitor device.

12. The capacitor device of claim 7, wherein a bottom side of the capacitor device comprises the signal terminal.

13. The capacitor device of claim 12, wherein the signal terminal comprises a central portion of the bottom side of the capacitor device.

14. The capacitor device of claim 12, wherein the bottom side of the capacitor device comprises the ground terminal.

15. The capacitor device of claim 12, wherein the ground terminal comprises the top side of the capacitor device, a first vertical side of the capacitor device, and a second vertical side of the capacitor device opposite to the first vertical side.

16. The capacitor device of claim 7, comprising a visual marking that indicates the ground terminal, or the signal terminal, or both.

17. A method to produce the capacitor device of claim 1, the method comprising:
stenciling a ground electrode in each ceramic sheet of a first set of ceramic sheets to form a set of ground electrode sheets, wherein each ground sheet of the set of ground electrode sheets comprises a respective top edge, and each respective ground electrode is separated from the respective top edge by a first distance;
stenciling a signal electrode in each ceramic sheet of a second set of ceramic sheets to form a set of signal electrode sheets, wherein each ceramic sheet of the set of signal electrode sheets comprises a respective top edge, each respective signal electrode is separated from the top edge by a second distance, and the second distance is larger than the first distance by an offset distance;
stacking the set of ground electrode sheets and the set of signal electrode sheets to form a capacitor body, wherein the set of ground electrode sheets and the set of signal electrode sheets are arranged perpendicular to a bottom of the capacitor body, each ground electrode sheet is disposed adjacent to a signal electrode sheet of the set of signal electrode sheets, wherein each respective top edge of the respective ground electrode sheet is aligned with each respective top edge of the respective signal electrode sheet, and wherein the capacitor body comprises a plurality of exposed ground electrode terminations and exposed signal electrode terminations;
forming a ground terminal that contacts the exposed ground electrode terminations; and
forming a signal terminal that contacts the exposed signal electrode terminations.

18. The method of claim 17, comprising adding a visual marking to the capacitor body that indicates the signal terminal, the ground terminal, or both.

19. The method of claim 17, wherein forming a ground terminal comprises a 1-step coating process, and wherein the ground terminal comprises a triangular shape.

20. The method of claim 17, wherein the offset distance is larger than a thickness of each ceramic sheet.

21. The method of claim 20, wherein the offset distance is at least 3 times larger than the thickness of each ceramic sheet.

22. A circuit package comprising:
a circuit board comprising a ground pad for coupling a ground terminal of a pseudo-shielded capacitor and a signal pad for coupling a signal terminal of the pseudo-shielded capacitor; and
the pseudo-shielded capacitor, wherein the pseudo-shielded capacitor comprises:
a visual marker configured to differentiate the ground terminal from the signal terminal;
a plurality of ground electrodes disposed in a vertical direction, wherein each ground electrode of the plurality of ground electrodes is disposed a first distance from a top side of the pseudo-shielded capacitor; and
a plurality of signal electrodes disposed in the vertical direction, wherein each signal electrode of the plurality of signal electrodes is disposed a second distance from the top side of the pseudo-shielded, wherein the second distance is smaller than the first distance by an offset distance.

23. The circuit package of claim 22, comprising a shield structure attached to the circuit board and coupled to a ground of the circuit board.

* * * * *